United States Patent
Yamazaki et al.

(10) Patent No.: US 8,048,773 B2
(45) Date of Patent: Nov. 1, 2011

(54) METHOD FOR MANUFACTURING SOI SUBSTRATE

(75) Inventors: Shunpei Yamazaki, Tokyo (JP); Masaki Koyama, Kanagawa (JP); Kosei Noda, Kanagawa (JP); Kenichiro Makino, Kanagawa (JP); Hideto Ohnuma, Kanagawa (JP); Kosei Nei, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/729,983

(22) Filed: Mar. 23, 2010

(65) Prior Publication Data

US 2010/0248444 A1 Sep. 30, 2010

(30) Foreign Application Priority Data

Mar. 24, 2009 (JP) .................. 2009-071103

(51) Int. Cl.
*H01L 21/30* (2006.01)
*H01L 21/46* (2006.01)

(52) U.S. Cl. ................. 438/458; 257/E21.568; 438/166; 438/311; 438/406; 438/455

(58) Field of Classification Search ........... 257/E21.568; 438/166, 311, 406, 455, 458
See application file for complete search history.

(56) References Cited

U.S. PATENT DOCUMENTS

| | | |
|---|---|---|
| 5,371,037 A | 12/1994 | Yonehara |
| 5,374,564 A | 12/1994 | Bruel |
| 5,484,746 A | 1/1996 | Ichikawa et al. |
| 5,824,574 A | 10/1998 | Yamazaki et al. |
| 6,144,041 A | 11/2000 | Yamazaki et al. |
| 6,191,007 B1 | 2/2001 | Matsui et al. |
| 6,251,754 B1 | 6/2001 | Ohshima et al. |
| 6,372,609 B1 | 4/2002 | Aga et al. |
| 6,373,075 B1 | 4/2002 | Yamazaki et al. |
| 6,380,046 B1 | 4/2002 | Yamazaki |
| 6,455,398 B1 | 9/2002 | Fonstad et al. |
| 6,610,996 B2 | 8/2003 | Yamazaki et al. |
| 6,903,368 B2 | 6/2005 | Yamaguchi et al. |
| 7,405,136 B2 | 7/2008 | Delprat et al. |
| 2002/0081823 A1* | 6/2002 | Cheung et al. ............. 438/455 |
| 2005/0255670 A1* | 11/2005 | Couillard et al. ........... 438/455 |
| 2006/0166472 A1 | 7/2006 | Henley et al. |
| 2008/0157095 A1* | 7/2008 | Son et al. .................... 257/74 |
| 2008/0242051 A1 | 10/2008 | Yamazaki et al. |
| 2009/0042362 A1 | 2/2009 | Moriwaka |
| 2009/0142904 A1 | 6/2009 | Isaka et al. |

FOREIGN PATENT DOCUMENTS

| | | |
|---|---|---|
| JP | 58069798 A | 4/1983 |
| JP | 62076715 A | 4/1987 |
| JP | 1248511 A | 10/1989 |
| JP | 01289240 A | 11/1989 |
| JP | 03008797 A | 1/1991 |
| JP | 3011618 A | 1/1991 |
| JP | 8250421 A | 9/1996 |
| JP | 11045862 A | 2/1999 |
| JP | 11163363 A | 6/1999 |
| JP | 2003124230 A | 4/2003 |

* cited by examiner

*Primary Examiner* — Asok Sarkar

(74) *Attorney, Agent, or Firm* — Fish & Richardson P.C.

(57) ABSTRACT

A single crystal semiconductor separated from a single crystal semiconductor substrate is formed partly over a supporting substrate with a buffer layer provided therebetween. The single crystal semiconductor is separated from the single crystal semiconductor substrate by irradiation with accelerated ions, formation of a fragile layer by the ion irradiation, and heat treatment. A non-single crystal semiconductor layer is formed over the single crystal semiconductor and irradiated with a laser beam to be crystallized, whereby an SOI substrate is manufactured.

24 Claims, 20 Drawing Sheets

101

105
103

111

121
131

181
131

131
133

FIG. 8A-1
FIG. 8B
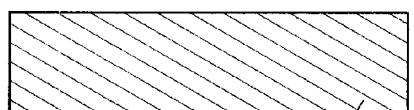
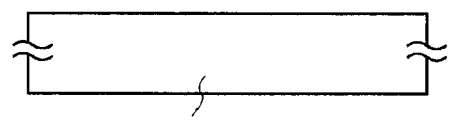
FIG. 8A-2
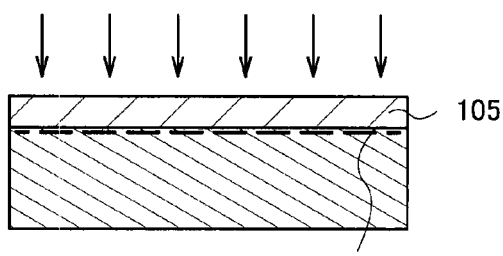
FIG. 8C
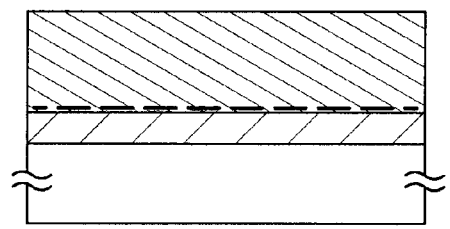
FIG. 8D
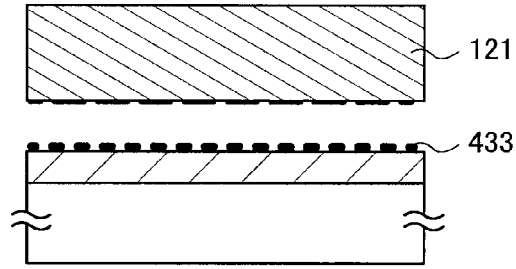
FIG. 8E
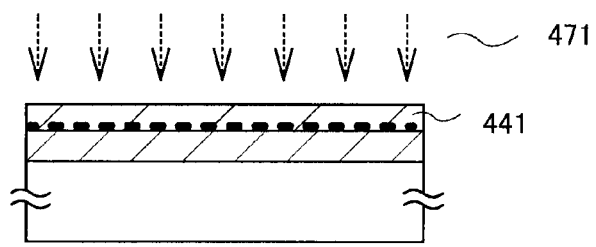
FIG. 8F
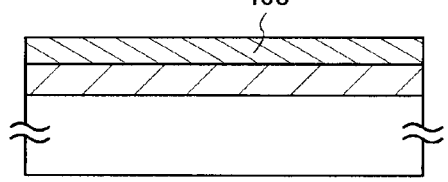

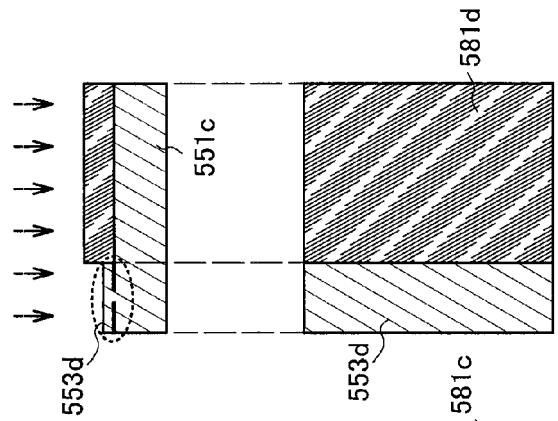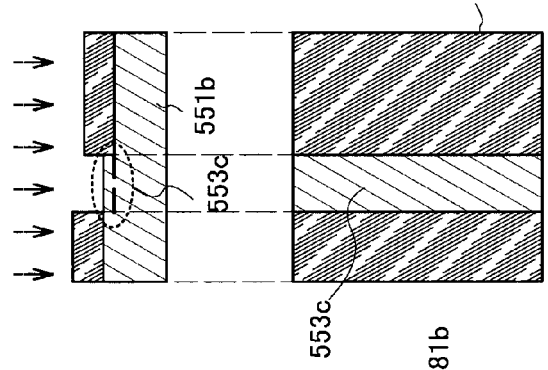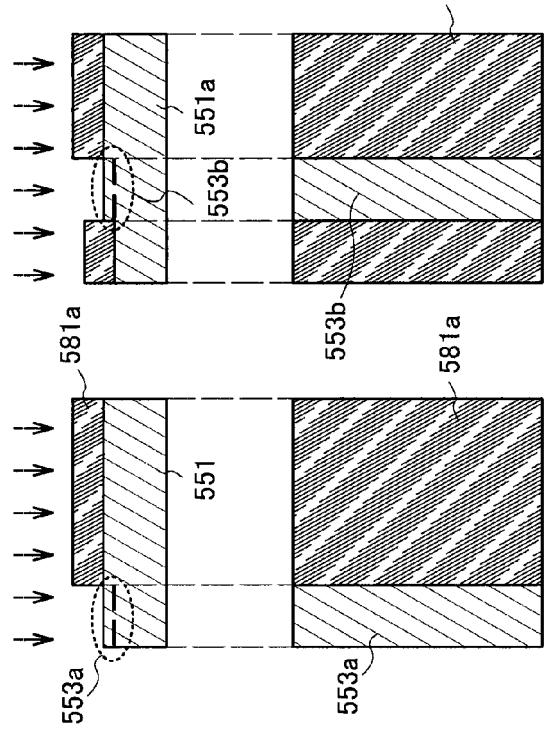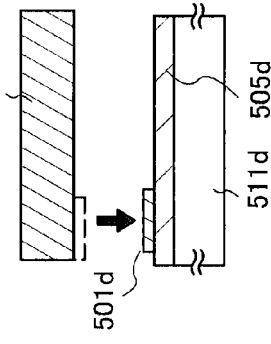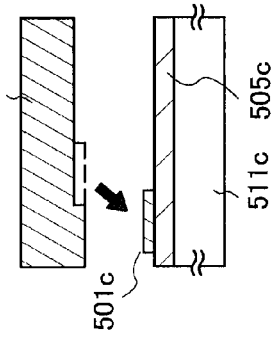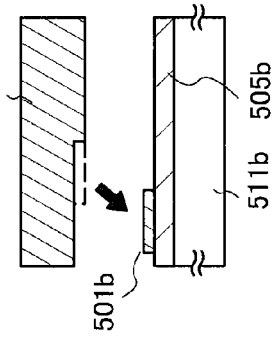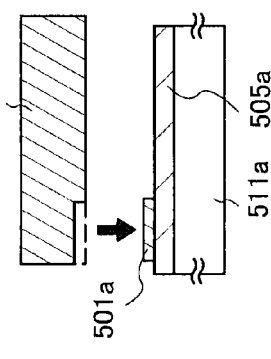

METHOD FOR MANUFACTURING SOI SUBSTRATE

BACKGROUND OF THE INVENTION

1. Field of the Invention

The present invention relates to a method for manufacturing a silicon on insulator (SOI) substrate in which a crystalline semiconductor layer is provided on an insulating surface and a method for manufacturing a semiconductor device.

Note that the semiconductor device in this specification indicates all the devices that operate by utilizing semiconductor characteristics. For example, electro-optic devices (including liquid crystal display devices and EL display devices), semiconductor circuits, and electronic devices are all included in the category of the semiconductor device.

2. Description of the Related Art

Flat-panel television sets to which thin display devices such as liquid crystal display devices and plasma display devices are applied have been widely used. In recent years, EL television sets to which electroluminescence (hereinafter also referred to as EL) display devices are applied have been developed. One of the main technologies thereof is a thin film transistor. By improving performance of a thin film transistor and reducing manufacturing cost thereof, thin display devices having excellent display performance can be provided inexpensively. In the market of the thin display device (a flat-panel display) where various companies are competing with each other, improvement in performance and cost reduction are essential to gain the ascendancy.

It is necessity that thin film transistors used for a flat-panel display is formed over an inexpensive and large-size substrate such as a glass substrate. In general, thin film transistors using amorphous silicon layers or polycrystalline silicon layers are formed. In terms of performance of a transistor, single crystal silicon is preferable; however, restrictions on a process, particularly restrictions on heat treatment temperature are severe in the case of employing a glass substrate.

On the basis of the above situation, methods for increasing the crystallinity of a semiconductor layer have been researched and developed in order to improve performance of a thin film transistor. As an example, there is a technique where amorphous silicon is irradiated with a laser beam to be polycrystallized. For example, in Patent Document 1, a technique is disclosed in which a high performance thin film transistor having a high quality polycrystal is obtained by scanning a laser beam aligned at an angle of crystal faces of a semiconductor layer.

REFERENCE

[Patent Document 1] Japanese Patent Laid-Open No. 2003-124230

SUMMARY OF THE INVENTION

A method of crystallizing a non-single crystal semiconductor layer by laser beam irradiation has a problem in that crystal nuclei are generated at random and the crystal orientations thereof are not aligned. Although characteristics of a crystal itself are excellent, it is difficult for a polycrystalline semiconductor layer of an aggregation of crystals to have as good characteristics as an single crystal semiconductor has due to the crystal orientations, the crystal grain boundaries, or the like. Therefore, by devising a method of scanning a laser beam as in Patent Document 1 or the like, the crystallinity of a semiconductor layer and performance of a thin film transistor are increased.

It is an object of one embodiment of the present invention to provide an SOI substrate including a semiconductor layer with a high crystallinity. It is an object of one embodiment of the present invention to provide an inexpensive SOI substrate. It is an object of one embodiment of the present invention to provide a high-performance semiconductor device using an SOI substrate including a semiconductor layer with a high crystallinity.

In one embodiment of the present invention, a non-single crystal semiconductor layer is crystallized using single crystal semiconductors separated from a single crystal semiconductor substrate, so that an SOI substrate including a crystalline semiconductor layer is manufactured. The non-single crystal semiconductor layer is crystallized using the single crystal semiconductors as seed crystals (crystal nuclei) by laser beam irradiation.

In one embodiment of the present invention, it is preferable that single crystal semiconductors be separated from a single crystal semiconductor substrate by irradiation with accelerated ions and formation of a fragile layer by the ion irradiation, and a non-single crystal semiconductor layer be crystallized using the separated single crystal semiconductors as seed crystals.

In one embodiment of the present invention, single crystal semiconductors separated from a single crystal semiconductor substrate are formed partly over a supporting substrate with a buffer layer provided therebetween, and a non-single crystal semiconductor layer is formed over the single crystal semiconductors and irradiated with a laser beam; thus, the non-single crystal semiconductor layer is crystallized using the single crystal semiconductors as seed crystals.

In the above structure, the fragile layer is formed in the single crystal semiconductor substrate by irradiating the single crystal semiconductor substrate with accelerated ions, and the single crystal semiconductor substrate and the supporting substrate are attached with the buffer layer provided therebetween. It is preferable that the single crystal semiconductor substrate be partly separated along the fragile layer by heat treatment, and the single crystal semiconductors be formed on parts of the buffer layer.

In one embodiment of the present invention, a non-single crystal semiconductor layer is formed over a supporting substrate with a buffer layer provided therebetween, single crystal semiconductors separated from a single crystal semiconductor substrate are formed on parts of the non-single crystal semiconductor layer and irradiated with a laser beam; thus, the non-single crystal semiconductor layer is crystallized using the single crystal semiconductors as seed crystals.

In the above structure, a fragile layer is formed in the single crystal semiconductor substrate by irradiating the single crystal semiconductor substrate with accelerated ions, and the single crystal semiconductor substrate and the supporting substrate are attached with the buffer layer and the non-single crystal semiconductor layer provided therebetween. It is preferable that the single crystal semiconductor substrate be partly separated along the fragile layer by heat treatment, so that the single crystal semiconductors be formed on part of the non-single crystal semiconductor layer.

In one embodiment of the present invention, the crystal orientations of single crystal semiconductors formed partly are preferably aligned.

In one embodiment of the present invention, a single crystal semiconductor substrate may be partly separated along a fragile layer to form a continuous layer of a single crystal semiconductor, and the continuous layer of the single crystal semiconductor may be selectively etched to form a single crystal semiconductor partly.

In one embodiment of the present invention, single crystal semiconductors can be formed partly to make a dot-pattern or a stripe pattern.

In one embodiment of the present invention, a single crystal semiconductor substrate is partly separated, and a cluster-shape single crystal semiconductor may be formed.

In one embodiment of the present invention, irradiation with a laser beam can be conducted while a non-single crystal semiconductor layer or a single crystal semiconductor is sprayed with a heated inert gas. Further, irradiation with the laser beam can be conducted while a supporting substrate is heated.

Note that the term "single crystal" in this specification refers to a crystal in which crystal faces are aligned and crystal axes are aligned, and atoms or molecules included in the single crystal are aligned in a spatially ordered manner. Although a single crystal is structured by orderly aligned atoms, the single crystal may include a lattice defect in which the alignment is disordered in a part or the single crystal may include intended or unintended lattice strain.

The term "fragile layer" in this specification refers to a region at which a single crystal semiconductor substrate is separated and the vicinity thereof. The states of the "fragile layer" vary according to a means for forming the "fragile layer". For example, the "fragile layer" indicates a region which is embrittled by locally distorting the crystal structure thereof. Note that a region from the surface of the single crystal semiconductor substrate to the "fragile layer" is somewhat embrittled in some cases. However, the "fragile layer" in this specification refers to a region at which separation is performed later and the vicinity thereof.

In this specification, a numeral such as "first", "second", or "third" which are included in a term is given for convenience in order to distinguish elements, does not limit the number and does not limit the arrangement and the order of the steps.

According to one embodiment of the present invention, an SOI substrate including a semiconductor layer with a high crystallinity can be provided. An inexpensive SOI substrate can be provided. Alternatively, a high-performance semiconductor device can be provided by using an SOI substrate including a semiconductor layer with a high crystallinity.

BRIEF DESCRIPTION OF THE DRAWINGS

In the accompanying drawings:

FIGS. 4A-1 and 4A-2 and FIGS. 4B to 4D are diagrams illustrating a method for manufacturing an SOI substrate according to one embodiment of the present invention;

FIGS. 5A-1 and 5A-2 and FIGS. 5B to 5D are diagrams illustrating a method for manufacturing an SOI substrate according to one embodiment of the present invention;

FIGS. 6A-1 and 6A-2 and FIGS. 6B to 6D are diagrams illustrating a method for manufacturing an SOI substrate according to one embodiment of the present invention;

FIGS. 8A-1 and 8A-2 and FIGS. 8B to 8F are diagrams illustrating a method for manufacturing an SOI substrate according to one embodiment of the present invention;

FIGS. 9A-1 to 9A-4 and FIGS. 9B-1 to 9B-4 are diagrams illustrating a method for manufacturing an SOI substrate according to one embodiment of the present invention;

Embodiments of the present invention will be described in detail with reference to the accompanying drawings. However, the present invention is not limited to the descriptions below, and it is easily understood by those skilled in the art that modes and details thereof can be modified in various ways without departing from the spirit and the scope of the present invention. Therefore, the present invention should not be limited to the descriptions of the embodiments below.

DETAILED DESCRIPTION OF THE INVENTION

Embodiment 1

In this embodiment, a method for manufacturing a crystalline semiconductor layer and a method for manufacturing an SOI substrate including the crystalline semiconductor layer are described.

Figure 1A:
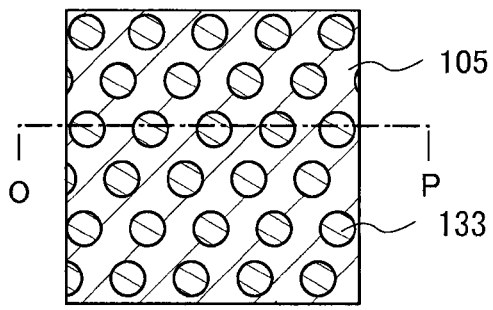
FIGS. 1A to 1D are diagrams illustrating a method for manufacturing an 501 substrate according to one embodiment of the present invention.
Figure 1B:
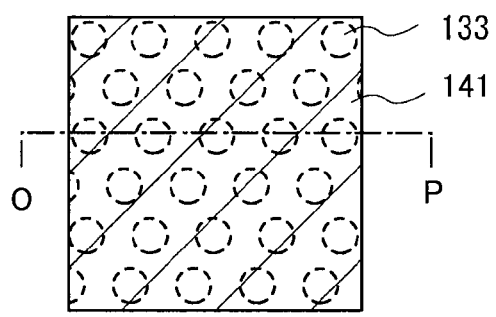
Figure 1C:
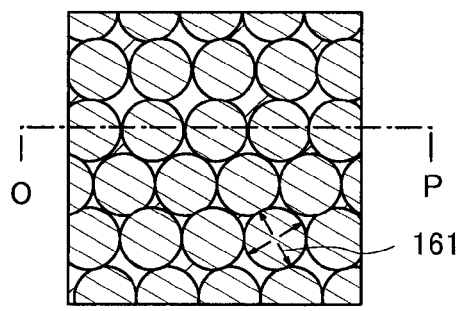
Figure 1D:
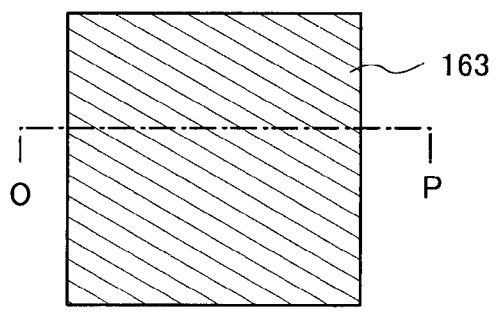
Figure 2A:
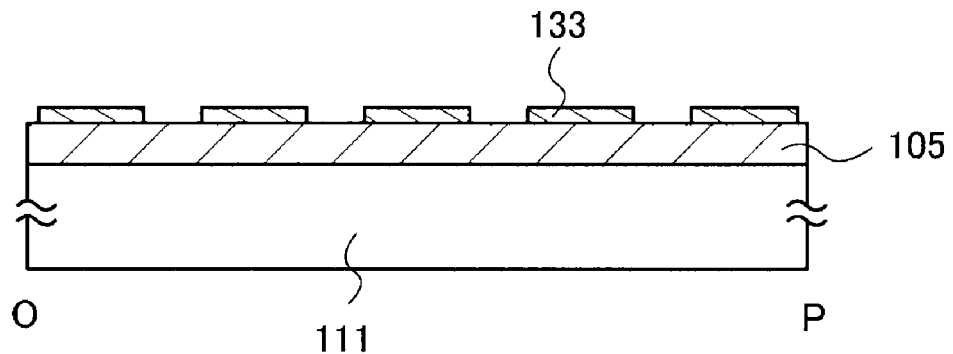
FIGS. 2A to 2C are diagrams illustrating a method for manufacturing an SOI substrate according to one embodiment of the present invention.
Figure 2B:
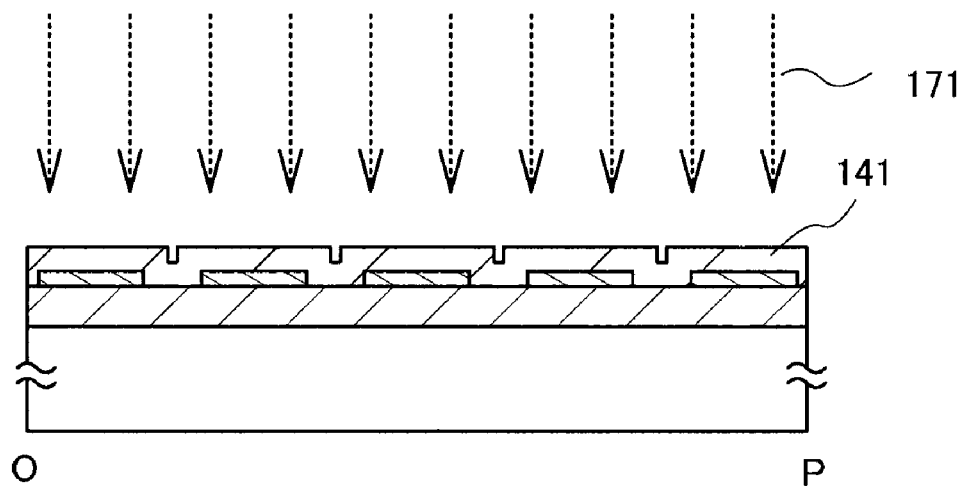
Figure 2C:
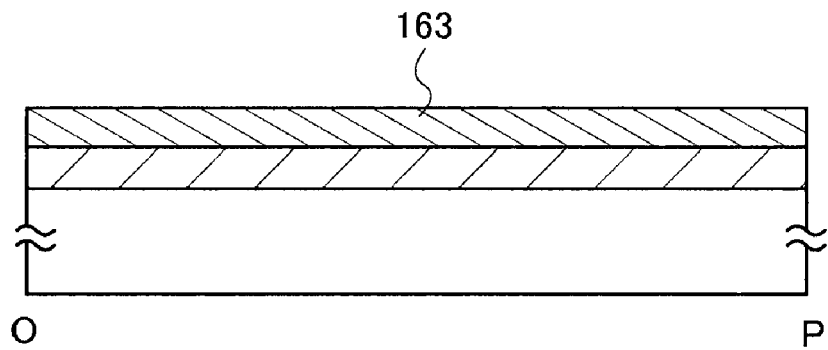

FIGS. 1A to 1D and FIGS. 2A to 2C are schematic views illustrating crystallization of one embodiment of the present invention. FIGS. 1A to 1D are plan views and FIGS. 2A to 2C are cross-sectional views taken along line O-P in FIGS. 1A to 1D.

A buffer layer 105 is formed on a supporting substrate 111, single crystal semiconductors 133 are formed on parts of the buffer layer 105 (FIG. 1A, FIG. 2A).

The single crystal semiconductors 133 are separated from a single crystal semiconductor substrate and attached to a supporting substrate 111. Here, an example where a plurality of single crystal semiconductors 133 each having an island shape is illustrated. The single crystal semiconductors 133 have no particular limitations on the shape and the like as long as the single crystal semiconductors 133 are formed on parts of the buffer layer 105, not on the entire surface of the buffer layer 105. Viewed from the top-plane, the single crystal semiconductors 133 are formed to make a dot-pattern or a stripe-pattern, for example. In the plurality of single crystal semiconductors 133, an individual single crystal semiconductor may have a variety of shapes such as a strip-shape, a circle-shape, or a polygonal-shape. FIG. 1A illustrates an example where circle-shape single crystal semiconductors are separately formed to make a dot-pattern. The single crystal semiconductors 133 may have the surface roughness larger than the average thickness of the single crystal semiconductors 133 and may partly have defects.

In the plurality of single crystal semiconductors 133 which are island shapes, the interval between single crystal semiconductors adjoining to each other is preferably set in consideration of lateral growth range in the case where each single crystal semiconductor serves as a seed crystal. Further, the density of the single crystal semiconductors, the area of individuals of the single crystal semiconductors, and the like with respect to the area of the buffer layer are preferably adjusted in consideration of the lateral growth range in the case where each single crystal semiconductor serves as a seed crystal. For example, the interval between single crystal semiconductors adjoining to each other is preferably approximately the sum of respective distances in which a single crystal semiconductor can laterally grow.

Figures 1, 3A:
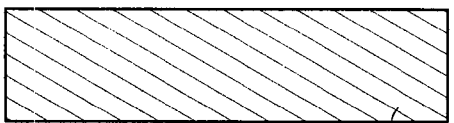
FIGS. 3A-1 and 3A-2 and FIGS. 3B to 3F are diagrams illustrating a method for manufacturing an SOI substrate according to one embodiment of the present invention.
Figures 2, 3A:
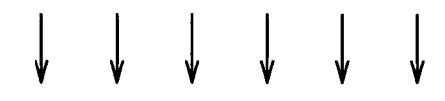

Next, a non-single crystal semiconductor layer 141 is formed over the single crystal semiconductors 133 (FIG. 1B, FIG. 2 B). The non-single crystal semiconductor layer 141 is formed over the entire surface of the buffer layer 105.

As the non-single crystal semiconductor layer 141, an amorphous semiconductor layer or a microcrystalline semiconductor layer is formed. Specifically, as examples thereof, an amorphous silicon layer, a microcrystalline silicon layer, an amorphous silicon germanium layer, an amorphous germanium layer, and the like are given. The non-single crystal semiconductor layer 141 is formed by a chemical vapor deposition (CVD) method, a sputtering method, or the like.

The non-single crystal semiconductor layer 141 is formed by a plasma CVD method, for example. A semiconductor source gas or a reaction gas in which a dilution gas is added as appropriate to a semiconductor source gas is introduced to a reaction chamber of a plasma CVD apparatus. Then, plasma is generated to form the non-single crystal semiconductor layer 141. As the semiconductor source gas, there are silicon hydride typified by silane and disilane, silicon chloride such as $SiH_2Cl_2$, $SiHCl_3$, and $SiCl_4$, and silicon fluoride such as $SiF_4$. As the dilution gas, there are hydrogen and a rare gas (e.g., helium, argon, krypton, neon) and the like. In a plasma CVD apparatus, plasma can be generated by applying, for example, a high-frequency power (including the VHF band) of greater than or equal to 3 MHz and less than or equal to 300 MHz (typically, 13.56 MHz, 27.12 MHz, 60 MHz, or the like) and a microwave power of greater than or equal to 1 GHz and less than or equal to 5 GHz (typically, 2.45 GHz). An object to be processed (here, the supporting substrate 111 provided with the buffer layer 105 and the single crystal semiconductor 133) is heated at greater than or equal to 100° C. and less than or equal to 300° C., preferably greater than or equal to 120° C. and less than or equal to 200° C. to form a film.

After the formation of the non-single crystal semiconductor layer 141, heat treatment is preferably performed. Specifically, heat treatment for desorbing hydrogen from the non-single crystal semiconductor layer 141 or the single crystal semiconductors 133 is preferably performed. Desorbing hydrogen in a semiconductor can prevent ablation of a semiconductor layer caused by laser beam irradiation.

The temperature of heat treatment is set to in the range from a temperature at which hydrogen is discharged from the non-single crystal semiconductor layer 141 or the single crystal semiconductors 133 to a temperature close to a strain point of the supporting substrate 111. As an apparatus used for the heat treatment, there are a diffusion furnace, a heating furnace such as a resistance heating furnace, a rapid thermal annealing (an RTA) apparatus, a microwave heating apparatus, and the like. In the case of using the RTA apparatus, the heat treatment can be conducted at a temperature close to the strain point of the substrate or a temperature slightly higher than the strain point.

Next, the non-single crystal semiconductor layer 141 is crystallized by irradiation with a laser beam 171 (FIG. 2B) to form a crystalline semiconductor layer 163 (FIG. 1D, FIG. 2C). The crystalline semiconductor layer 163 is formed over the supporting substrate 111 with the buffer layer 105 provided therebetween, whereby an SOI substrate can be manufactured.

The non-single crystal semiconductor layer 141 is melted by the irradiation with the laser beam 171. As long as the non-single crystal semiconductor layer 141 is irradiated with the laser beam, the laser beam irradiation may be performed from the non-single crystal semiconductor layer 141 side or from the supporting substrate 111 side. Note that the irradiation with the laser beam 171 by which the single crystal semiconductors 133 are not completely melted is preferably conducted in order that the single crystal semiconductors 133 each serve as a seed crystal (a crystal nucleus). The single crystal semiconductors 133 are made by separating from a single crystal semiconductor substrate. When the single crystal semiconductors 133 are separated from the same single crystal semiconductor substrate, the crystal orientations thereof can be substantially aligned.

The non-single crystal semiconductor layer 141 is melted and the single crystal semiconductors 133 are crystallized as seed crystals by the irradiation with the laser beam 171, whereby crystallization can be performed on the basis of the crystal orientations of the single crystal semiconductors 133. As a result, as compared with the case of crystallization of an amorphous semiconductor layer with laser beam irradiation as in a conventional manner for making a polysilicon, the crystal orientations can be aligned. Therefore, the crystalline semiconductor layer 163 having an excellent crystallinity, and further, having a high crystallinity, which is substantially the same as that of a single crystal semiconductor layer, can be obtained. In one mode of this embodiment, it is not necessary for the laser beam irradiation be complicatedly controlled as compared with that in Patent Document 1 because of the presence of seed crystals; thus, the process is easy and the productivity is high.

FIG. 1C schematically illustrates that the dotted single crystal semiconductors 133 illustrated in FIG. 1B serve as seed crystals and crystal growth proceeds. The crystal growth of the single crystal semiconductors 133 can concentrically proceed from the center as shown by an arrow 161 in FIG. 1C.

There are no limitations on the kinds of a laser which emits the laser beam 171 as long as the laser can emit a laser beam by which the non-single crystal semiconductor layer 141 is melt. As examples thereof, a pulsed laser and a continuous-wave laser (a CW laser) are given.

Specific examples of the pulsed laser include an Ar laser, an excimer (ArF, KrF, XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, and a copper vapor laser. Specific examples of the continuous-wave laser include an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, and a helium cadmium laser.

The laser beam 171 has a wavelength at which the light is absorbed by the non-single crystal semiconductor layer 141. The specific wavelength may be determined in consideration of the penetration length of the laser beam 171 or the like. The energy density of the laser beam 171 may be determined in consideration of the wavelength of the laser beam 171, and a material and the thickness of the non-single crystal semiconductor layer 141, and the like.

The laser beam 171 may be emitted under an atmosphere including oxide (e.g., an air atmosphere), or under an inert atmosphere such as an atmosphere including nitrogen or a rare gas. In order to control the atmosphere in which the irradiation with the laser beam 171 is conducted, the irradiation with the laser beam 171 may be performed in an airtight chamber where the atmosphere is controlled. In the case where the chamber is not used, by spraying an inert gas such as a nitrogen gas to the surface irradiated with the laser beam 171, the inert atmosphere can be formed. Alternatively, the irradiation with the laser beam 171 may be conducted in vacuum.

The non-single crystal semiconductor layer 141 may be irradiated with the laser beam 171 while being heated. For example, a stage, on which the supporting substrate 111 provided with the non-single crystal semiconductor layer 141 is placed, is provided with a heating means, and the non-single crystal semiconductor layer 141 is irradiated with the laser beam 171 while being heated by heating of the stage. Alternatively, the non-single crystal semiconductor layer 141 can be irradiated with the laser beam 171 while being sprayed with a heated inert gas (e.g., a nitrogen gas). Further alternatively, the irradiation with the laser beam 171 may be conducted while the stage is heated and while the non-single crystal semiconductor layer 141 is sprayed with the heated inert gas.

The cross-sectional shape of the laser beam 171 can be a linear-shape, a rectangle-shape (including a square-shape and a strip-shape). The cross-sectional shape of the laser beam 171 can be adjusted as appropriate by an optical system.

An SOI substrate manufactured in a manner described above includes a crystalline semiconductor layer with an excellent crystallinity. Therefore, a high-performance semiconductor device can be manufactured by using the SOI substrate including the crystalline semiconductor layer with an excellent crystallinity.

Note that a step caused by stacking the non-single crystal semiconductor layer 141 over the single crystal semiconductors 133 can be planarized by the irradiation with the laser beam 171 for crystallizing the non-single crystal semiconductor layer 141. When the step is not sufficiently planarized, as needed, etching (dry-etching or wet-etching), irradiation with a laser beam, chemical mechanical polishing (CMP) treatment, or the like may be performed as appropriate. Alternatively, it is also possible that the step is left and components whose usages are different are formed over the same substrate.

Next, a method for forming the single crystal semiconductors 133 on parts of the buffer layer, as in FIG. 1A and FIG. 2A, is described.

The single crystal semiconductors 133 are preferably formed by using ion (typically, hydrogen ion) irradiation and separation from a single crystal semiconductor substrate along a fragile layer formed by the ion irradiation. The amount of a single crystal semiconductor substrate used can be reduced in such a manner. Further, a single crystal semiconductor substrate after the separation can be reused. As a result, resource saving and cost reduction are possible; thus, an inexpensive SOI substrate can also be provided.

There are examples of a method for forming the single crystal semiconductors 133 on parts of the buffer layer (1) by forming the single crystal semiconductor layer on the buffer layer and then, etching selectively the single crystal semiconductor layer, (2) by forming the fragile layer partly in the single crystal semiconductor substrate, (3) by etching selectively the single crystal semiconductor substrate to form a plurality of projecting portions, forming the fragile layer, and then attaching the single crystal semiconductor substrate and the supporting substrate, and (4) by forming the fragile layer, etching selectively the single crystal semiconductor substrate to form a plurality of projecting portions, and then attaching the single crystal semiconductor substrate and the supporting substrate. Examples of (1) to (4) are described below.

In FIGS. 3A-1 and 3A-2 and FIGS. 3B to 3F, an example of forming the single crystal semiconductors on parts of the buffer layer (1) by forming the single crystal semiconductor layer on the buffer layer and then, etching selectively the single crystal semiconductor layer is illustrated.

Figure 3B:
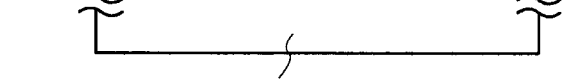

A single crystal semiconductor substrate 101 is prepared (FIG. 3A-1). The supporting substrate 111 is also prepared (FIG. 3B).

The examples of the single crystal semiconductor substrate 101 include a single crystal semiconductor substrate formed using an element belonging to Group 14 of the periodic table, such as a single crystal silicon substrate, a single crystal germanium substrate, or a single crystal silicon germanium substrate. In addition, a compound semiconductor substrate such as a gallium arsenide substrate or an indium phosphide substrate is given.

As the supporting substrate 111, a glass substrate, a quartz substrate, a ceramic substrate, a sapphire substrate, or the like is used. In order to provide an SOI substrate and a semiconductor device using the SOI substrate, which are inexpensive and large in size, a glass substrate is preferably used as the supporting substrate 111. Examples of the glass substrate include an aluminosilicate glass substrate, an aluminoborosilicate glass substrate, and a barium borosilicate glass substrate, which are used for electronic industries.

It is preferable that the surfaces of the single crystal semiconductor substrate 101 and the supporting substrate 111 be cleaned as appropriate using a sulfuric acid/hydrogen peroxide mixture (SPM), an ammonium hydroxide/hydrogen peroxide mixture (APM), a hydrochloric acid/hydrogen peroxide mixture (HPM), diluted hydrogen fluoride (DHF), or the like in terms of removing contaminations. Alternatively, diluted hydrogen fluoride and ozone water may be discharged alternately to clean the surface of the single crystal semiconductor substrate 101 or the surface of the supporting substrate 111.

The buffer layer 105 is formed on the single crystal semiconductor substrate 101. A fragile layer 103 is formed in the single crystal semiconductor substrate 101 (FIG. 3A-2).

The fragile layer 103 where crystal structure is damaged is formed at a predetermined depth from a surface of the single crystal semiconductor substrate 101. The fragile layer 103 can be formed by irradiating the single crystal semiconductor substrate 101 with ions having kinetic energy, such as hydrogen ions.

Specifically, by irradiating the single crystal semiconductor substrate 101 with accelerated ions having kinetic energy, elements included in the irradiated ions are added to a region at the predetermined depth from the surface of the single crystal semiconductor substrate 101; thus, the fragile layer 103 is formed. The ions having kinetic energy are obtained in such a manner that a source gas is excited to produce plasma of the source gas and ions included in the plasma are extracted from the plasma by an electric field effect and accelerated.

The depth at which the fragile layer 103 is formed can be adjusted by the kinetic energy, mass, charge, and an irradiation angle of the ions. In addition, in the case where the fragile layer is formed by irradiating the single crystal semiconductor substrate with ions from the buffer layer side, the depth at which the fragile layer 103 is formed can be adjusted by varying the thickness of the buffer layer. Kinetic energy of the ions can be adjusted by acceleration voltage, dose, or the like.

Alternatively, the fragile layer 103 can be formed by an ion doping method or an ion implantation method. A typical ion doping apparatus used for the ion doping method is a non-mass-separation apparatus with which an object to be processed that is placed in a chamber is irradiated with all kinds of ions generated by excitation of a process gas into plasma. With the non-mass-separation apparatus, the object to be processed is irradiated with all kinds of ions without mass separation of ions in plasma. In contrast, an ion implantation apparatus used for the ion implantation method is a mass-separation apparatus. With the ion implantation apparatus, an object to be processed is irradiated with ions having a specific mass through mass separation of ions in plasma.

Here, the fragile layer 103 is preferably formed as shallow as possible from the surface of the single crystal semiconductor substrate 101. In order to form the fragile layer 103 in a shallow region of the single crystal semiconductor substrate 101, there are the following methods: a thick insulating layer or the like is formed over the single crystal semiconductor substrate, and then ion irradiation is conducted from the insulating layer side; alternatively, an accelerating voltage, a voltage applied for accelerating ions, is lowered. Formation of the fragile layer 103 in a shallow region decreases the amount of the single crystal semiconductor separated from the single crystal semiconductor substrate 101 and increases the amount of the single crystal semiconductor to be reused; thus, manufacture cost reduction and resource saving can be achieved. Further, a low accelerating voltage enables reduction of doses, whereby a period of ion irradiation step, which is a rate-controlling factor, can be shortened. Accordingly, takt time can be reduced, which can lead to increase in productivity.

The buffer layer 105 is formed to have a single layer structure or a stacked-layer structure including two or more layers in which an insulating layer such as a silicon oxide layer, a silicon oxynitride layer, a silicon nitride layer, and a silicon nitride oxide layer is used. The insulating layer included in the buffer layer 105 is formed by a CVD method, a sputtering method, an atomic layer epitaxy (ALE) method, a thermal oxidation method, or the like.

Here, the silicon oxynitride layer in this specification includes more oxygen than nitrogen, and the concentrations of oxygen, nitrogen, silicon, and hydrogen ranges from 50 at. % to 70 at. %, 0.5 at. % to 15 at. %, 25 at. % to 35 at. %, and 0.1 at. % to 10 at. %, respectively, in the case where measurements are performed preferably using Rutherford backscattering spectrometry (RBS) and hydrogen forward scattering (HFS). Further, a silicon nitride oxide layer includes more nitrogen than oxygen, and the concentrations of oxygen, nitrogen, silicon, and hydrogen ranges from 5 at. % to 30 at. %, 20 at. % to 55 at. %, 25 at. % to 35 at. %, and 10 at. % to 30 at. %, respectively, in the case where measurements are performed using RBS and HFS.

The buffer layer 105 may be formed on either or both surfaces of the single crystal semiconductor substrate 101 and the supporting substrate 111. The buffer layer is formed before, after, or before and after the formation of the fragile layer 103 in the single crystal semiconductor substrate 101. Alternatively, the buffer layer may be formed on only the supporting substrate 111 side, or may be formed on the single crystal semiconductor substrate 101 side and the supporting substrate 111 side. The buffer layer may be a single layer or a stacked layer of two or more layers.

Figure 3C:

The single crystal semiconductor substrate 101 and the supporting substrate 111 are attached with the buffer layer 105 provided therebetween (FIG. 3C).

In the case of forming the buffer layer on only the single crystal semiconductor substrate 101, the surfaces of the buffer layer and the supporting substrate 111 are bonded to each other. In the case of forming the buffer layer on only the supporting substrate 111, the surfaces of the buffer layer and the single crystal semiconductor substrate 101 are bonded to each other. In the case of forming the buffer layers on the surfaces of the single crystal semiconductor substrate 101 and the supporting substrate 111, the surfaces of the buffer layers thereof are bonded to each other.

For example, when the single crystal semiconductor substrate 101 and the supporting substrate 111 are faced to each other, and the buffer layer 105 on the single crystal semiconductor substrate 101 is disposed in contact with the surface of the supporting substrate 111. Then, a pressure of greater than or equal to 0.1 N/cm$^2$ and less than or equal to 50 N/cm$^2$, preferably greater than or equal to 0/1 N/cm$^2$ and less than or equal to 20 N/cm$^2$, for example about 1 N/cm$^2$, is applied to one portion in the single crystal semiconductor substrate 101. A bonding between the buffer layer 105 and the supporting substrate 111 begins at the pressed portion, and then the spontaneous bonding proceeds throughout the surface. This bonding step is performed by Van der Waals force or hydrogen bonding, and can be performed at room temperature without heat treatment. Thus, a substrate having a low heat-resistance temperature, such as a glass substrate, can be used as the supporting substrate 111.

Note that the attachment may be performed after the bonding planes of the single crystal semiconductor substrate 101 and the supporting substrate 111 are subjected to surface treatment. As the surface treatment, plasma treatment, ozone treatment, megasonic cleaning, two-fluid cleaning (a method of spraying functional water such as pure water or hydrogen-containing water with a carrier gas such as nitrogen), or combination of these methods can be employed. After plasma treatment is performed on the bonding planes, ozone treatment, megasonic cleaning, two-fluid cleaning, or the like is performed, whereby dust such as an organic substance on the bonding planes can be removed and the surfaces can be made hydrophilic. As a result, bonding strength at the bonding interfaces of the single crystal semiconductor substrate 101 and the supporting substrate 111 can be increased.

Further, after the surface of the buffer layer 105 is disposed in contact with the surface of the supporting substrate 111 to bond the two to each other, heat treatment is preferably performed to increase the bonding strength at the bonding interfaces. The heat treatment is performed at a temperature at which a crack is not generated in the fragile layer 103, for example, at a temperature higher than or equal to room temperature and lower than 410° C. Alternatively, under the atmosphere heated in the range of greater than or equal to room temperature and less than 410° C., the surface of the buffer layer 105 may be disposed in contact with the surface of the supporting substrate 111 to bond the two to each other.

As examples of an apparatus used for the heat treatment, a diffusion furnace, a heating furnace such as a resistance heating furnace, an RTA apparatus, and a microwave heating apparatus are given. The heat treatment for increasing the bonding strength is preferably performed in succession in the apparatus or at the place where the attachment is performed. In addition, after the heat treatment for increasing bonding strength, heat treatment for separating the single crystal semiconductor substrate 101 along the fragile layer 103 may be successively performed.

Figure 3D:
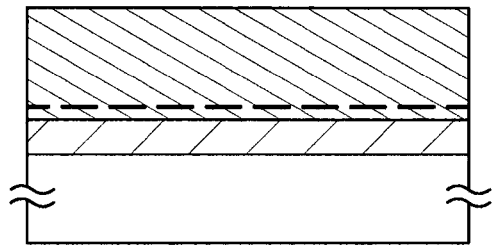
Figure 3E:
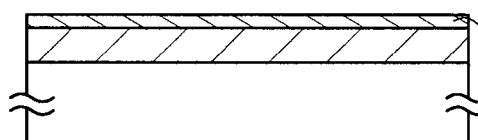

When the single crystal semiconductor substrate 101 is separated along the fragile layer 103 formed in the single crystal semiconductor substrate 101, a single crystal semiconductor layer 131 is formed over the supporting substrate 111 with the buffer layer 105 provided therebetween (FIG. 3D). Here, an example of forming the single crystal semiconductor layer 131 which is a continuous layer of a single crystal semiconductor is illustrated.

By the heat treatment, for example, the single crystal semiconductor substrate 101 can be separated along the fragile layer 103. This is because the microvoids formed in the fragile layer 103 change in volume due to temperature increase caused by the heat treatment, and a crack is generated in the fragile layer 103. Note that temperature of the heat treatment is set within the range from greater than or equal to temperature at which a crack is generated in the fragile layer 103 to temperature close to a strain point of the supporting substrate 111. As an apparatus used for the heat treatment, as in the heat treatment for increasing the bonding strength described above, a heating furnace, an RTA apparatus, and a microwave heating apparatus are given. For example, in the case where an RTA apparatus is used, the single crystal semiconductor substrate 101 can be separated at a heating temperature of 550° C. to 730° C. inclusive, within a process time of 0.5 minutes to 60 minutes inclusive.

Figure 3F:
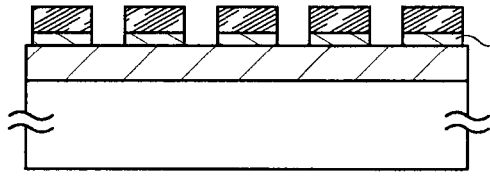

The single crystal semiconductor layer 131 is selectively removed to form the single crystal semiconductors 133 on parts of the buffer layer 105 (FIG. 3F).

The selective removal of the single crystal semiconductor layer 131 is conducted by a photolithography technique and an etching technique. As in FIG. 3E, a mask 181 is formed on parts of the single crystal semiconductor layer 131. As the mask 181, a resist mask is formed, for example. The mask 181 is formed to make a dot-pattern or a stripe-pattern, for example, viewed from the top-plane because the shape of the mask 181 is reflected in the single crystal semiconductors 133. The single crystal semiconductor layer 131 is etched using the mask 181, whereby the single crystal semiconductors 133 are formed. In such a manner, the single crystal semiconductor layer that is a continuous layer is selectively etched to form a discontinuous layer of the single crystal semiconductors. Note that the mask 181 which becomes unnecessary may be removed as appropriate.

Through the above steps, the single crystal semiconductors 133 can be formed on parts of the buffer layer 105.

Next, an example of forming the single crystal semiconductors on parts of the buffer layer (2) by forming the fragile layer partly in the single crystal semiconductor substrate is illustrated in FIGS. 4A-1 and 4A-2 and FIGS. 4B to 4D. Note that description of steps which are the same as or similar to the steps of FIGS. 3A-1 and 3A-2 and FIGS. 3B to 3F are omitted or simplified.

Figures 1, 4A:
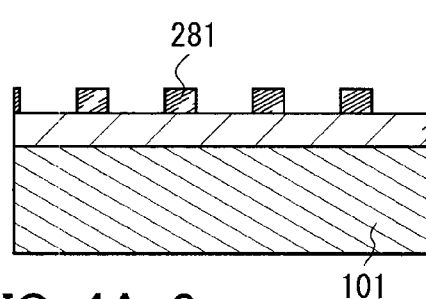

A mask 281 is formed partly over the single crystal semiconductor substrate 101 on which the buffer layer 105 is formed (FIG. 4A-1).

The mask 281 is used for ion irradiation. Accordingly, the shape of the mask 281 is reflected in the single crystal semiconductor substrate 101; thus, the fragile layer is formed under the regions where the mask 281 is not formed in the single crystal semiconductor substrate 101. Viewed from the top, the mask is formed so that the regions where the mask 281 is not formed make a dot-pattern or a stripe-pattern, for example.

Note that as the mask 281, a mask having resistance against ion irradiation is used. Specifically, an insulating layer such as a silicon oxide layer, a silicon nitride layer, a silicon oxynitride layer, or a silicon nitride oxide layer is preferably formed as a hard mask.

A thin insulating layer (such as a silicon oxide layer or a silicon nitride layer) with a thickness of less than or equal to 10 nm may be formed in a region where the mask 281 is not provided (an opening portion of the mask 281). Providing the insulating layer can prevent the buffer layer 105 from being etched by the ion irradiation, which is conducted for forming the fragile layer. The insulating layer with a thickness of less than or equal to 10 nm is preferably formed by radical treatment (such as oxygen radical treatment or nitrogen radical treatment), or plasma treatment (oxygen plasma treatment or nitrogen plasma treatment), for example. Alternatively, a chemical oxide which is formed using an oxidizing chemical agent may be used.

Parts of regions in the single crystal semiconductor substrate are embrittled to form the fragile layer 203 (FIG. 4A-2).

The mask 281 blocks the ion irradiation, so that the regions where the mask 281 is not formed are embrittled to form the fragile layer 203. Note that the fragile layer 203 is formed as shallow as possible from the surface of the single crystal semiconductor substrate 101. The mask 281 which becomes unnecessary may be removed by etching or the like.

Figure 4B:
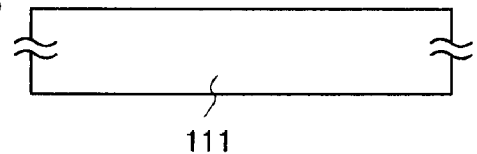
Figures 2, 4A:
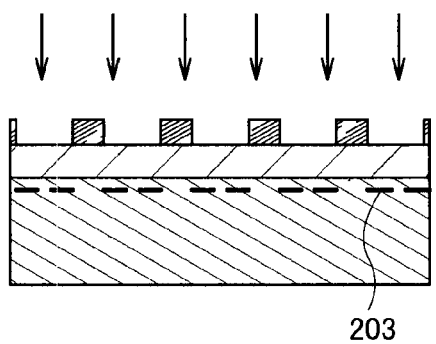

The supporting substrate 111 is prepared (FIG. 4B). Note that, although not illustrated in the drawing, a buffer layer (e.g., an insulating layer) similar to the buffer layer 105 is preferably formed on the supporting substrate 111 side.

Figure 4C:
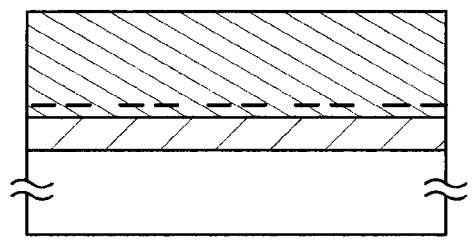

The single crystal semiconductor substrate 101 and the supporting substrate 111 are attached with the buffer layer 105 provided therebetween (FIG. 4C).

Figure 4D:
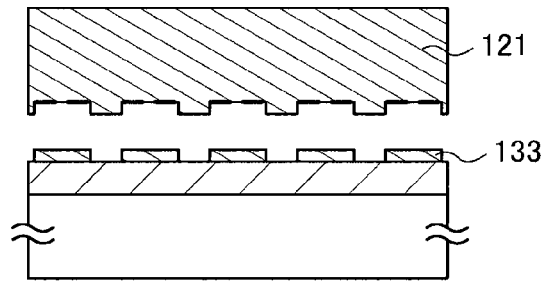

The single crystal semiconductor substrate 101 is separated along the fragile layer 203 formed in the single crystal semiconductor substrate 101. The single crystal semiconductors 133 are formed partly over the supporting substrate 111 with the buffer layer 105 provided therebetween (FIG. 4D).

The fragile layer 203 is formed partly in the single crystal semiconductor substrate 101. Therefore, in the separation step of the single crystal semiconductor substrate 101 using heat treatment or the like, regions where the fragile layer 203 is formed and the vicinity thereof can be selectively bonded to the buffer layer 105.

Through the above steps, the single crystal semiconductors 133 can be formed on parts of the buffer layer.

Next, illustrated in FIGS. 5A-1 and 5A-2 and FIGS. 5B to 5D is an example of forming the single crystal semiconductors on parts of the buffer layer (3) by etching selectively the single crystal semiconductor substrate to form a plurality of projecting portions, forming the fragile layer, and then attaching the single crystal semiconductor substrate and the supporting substrate. Note that description of steps which are the same as or similar to the steps of FIGS. 3A-1 and 3A-2 and FIGS. 3B to 3F and FIGS. 4A-1 and 4A-2 and FIGS. 4B to 4D are omitted or simplified.

Figures 1, 5A:
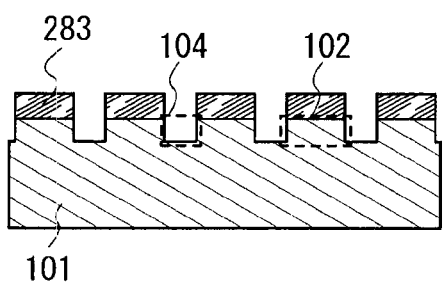

The single crystal semiconductor substrate 101 is selectively etched to form grooves (hereinafter also referred to as depressed portions 104); thus, a plurality of portions where the single crystal semiconductor substrate 101 is left (hereinafter also referred to as projecting portions 102) is obtained (FIG. 5A-1).

Since the single crystal semiconductors 133 are formed on the basis of the projecting portions 102, the projecting portions 102 are formed to make a dot-pattern or a stripe-pattern, for example, viewed from the top-plane. For example, a mask 283 formed using resist is formed over the single crystal semiconductor substrate 101 by a photolithography technique and an etching technique, then, the single crystal semiconductor substrate 101 is selectively etched to form the grooves; accordingly, a plurality of projecting portions 102 is formed. Note that when the depths of the grooves (the depressed portions 104) are made larger than the depth of the fragile layer formed in the projecting portions 102, only the projecting portions 102 can be easily separated. The mask 283 which becomes unnecessary may be removed as appropriate.

After the removal of the mask 283, a thin insulating layer (such as a silicon oxide layer or a silicon nitride layer) with a thickness of less than or equal to 10 nm is preferably formed on the surface of the single crystal semiconductor substrate 101, on which the depressed portions 104 are formed. Providing the insulating layer can prevent the single crystal semiconductor substrate 101 from being etched by the ion irradiation, which is conducted for forming the fragile layer. The insulating layer with a thickness of less than or equal to 10 nm is preferably formed by radical treatment (such as oxygen radical treatment or nitrogen radical treatment), or plasma treatment (oxygen plasma treatment or nitrogen plasma treatment), for example. Alternatively, a chemical oxide which is formed using an oxidizing chemical agent may be used.

Fragile layer 223 is formed in the single crystal semiconductor substrate 101 (FIG. 5A-2). The fragile layer 223 is formed at different depths depending on the projecting portions 102 and the depressed portions 104 formed in the single crystal semiconductor substrate 101. Note that when the single crystal semiconductor substrate 101 is irradiated with ions, an insulating layer serving as a protection layer may be formed.

Figure 5B:
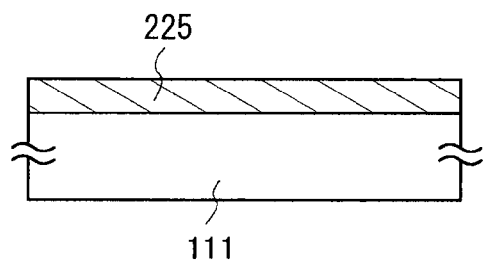
Figures 2, 5A:
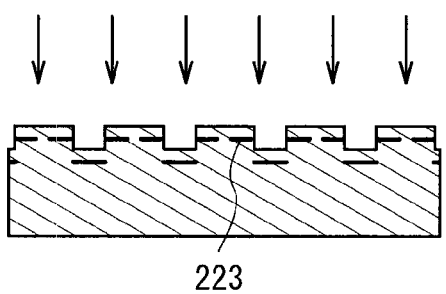

The supporting substrate 111 is prepared, and a buffer layer 225 is formed on the supporting substrate 111 (FIG. 5B). The buffer layer 225 may be formed using a material and a method which are the same as or similar to those of the buffer layer 105.

Figure 5C:
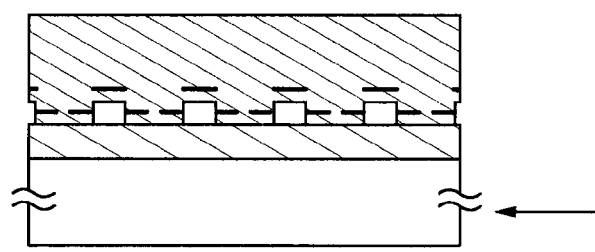

The single crystal semiconductor substrate 101 and the supporting substrate 111 are attached with the buffer layer 225 provided therebetween (FIG. 5C). The single crystal semiconductor substrate 101 is provided with the plurality of projecting portions 102, and the surfaces of the projecting portions 102 are bonded to the surface of the buffer layer 225.

Figure 5D:
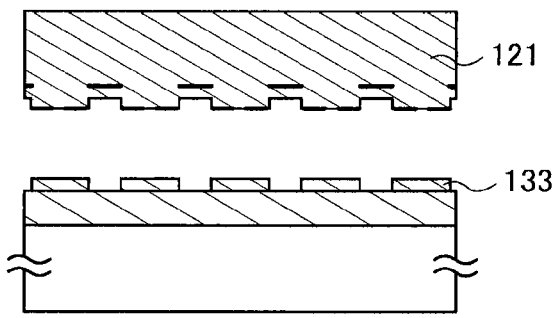

The single crystal semiconductor substrate 101 is separated along the fragile layer 223 formed in the single crystal semiconductor substrate 101. The single crystal semiconductors 133 are formed partly over the supporting substrate 111 with the buffer layer 225 provided therebetween (FIG. 5D).

In the single crystal semiconductor substrate 101, the projecting portions 102 are bonding to the buffer layer 225. Therefore, in the separation step of the single crystal semiconductor substrate 101 using heat treatment or the like, the projecting portions 102 can be selectively left on the buffer layer 225.

Through the above steps, the single crystal semiconductors 133 can be formed on parts of the buffer layer.

Next, illustrated in FIGS. 6A-1 and 6A-2 and FIGS. 6B to 6D is an example of forming the single crystal semiconductors on parts of the buffer layer (4) by forming the fragile layer, etching selectively the single crystal semiconductor substrate to form a plurality of projecting portions, and then attaching the single crystal semiconductor substrate and the supporting substrate. Note that description of steps which are the same as or similar to the steps of FIGS. 3A-1 and 3A-2 and FIGS. 3B to 3F, FIGS. 4A-1 and 4A-2 and FIGS. 4B to 4D, and FIGS. 5A-1 and 5A-2 and FIGS. 5B to 5D are omitted or simplified.

Figures 1, 6A:
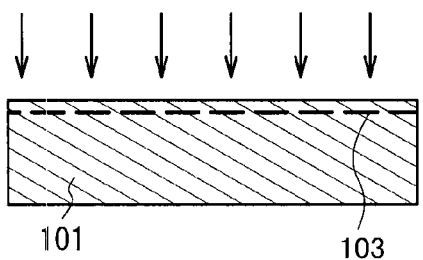

The fragile layer 103 is formed in the single crystal semiconductor substrate 101 (FIG. 6A-1).

When the fragile layer 103 is formed, it is preferable that an insulating layer serving as a protection layer be formed over the single crystal semiconductor substrate 101, and then ion irradiation be performed. For example, an insulating layer with a thickness of less than or equal to 10 nm, which is obtained by a chemical oxide, radical treatment, plasma treatment, or the like, is formed as a protection layer. Providing the protection layer can prevent the single crystal semiconductor substrate 101 from being etched by the ion irradiation.

The single crystal semiconductor substrate 101 is selectively etched to form grooves (hereinafter also referred to as depressed portions 246); thus, a plurality of portions where the single crystal semiconductor substrate 101 is left (hereinafter also referred to as projecting portions 244) is obtained (FIG. 6A-2).

Like the above-described case illustrated in FIG. 5D, the single crystal semiconductors 133 are formed on the basis of the projecting portions 244. A mask 285 is formed to make a desired shape, and the single crystal semiconductor substrate 101 is selectively etched to form grooves (the depressed portions 246); accordingly, a plurality of projecting portions 244 is formed. Here, by making the depth of the grooves (the depressed portions 246) larger than that of the fragile layer 103 in the projecting portions 244, the fragile layer 103 is formed only in the projecting portions 244. The mask 285 which becomes unnecessary is removed as appropriate.

Figure 6B:
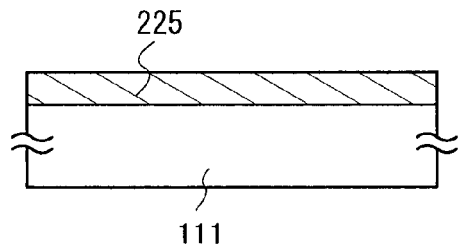
Figures 2, 6A:
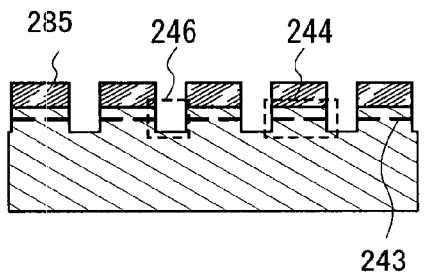

The supporting substrate 111 is prepared, and the buffer layer 225 is formed on the supporting substrate 111 (FIG. 6B).

Figure 6C:
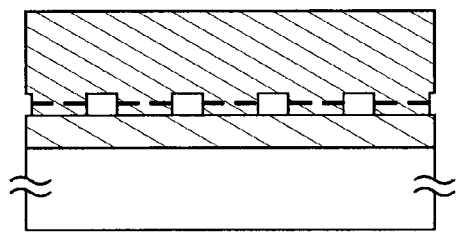

The single crystal semiconductor substrate 101 and the supporting substrate 111 are attached with the buffer layer 225 provided therebetween (FIG. 6C). The single crystal semiconductor substrate 101 is provided with the plurality of projecting portions 244, and the surfaces of the projecting portions 244 are bonded to the surface of the buffer layer 225.

Figure 6D:
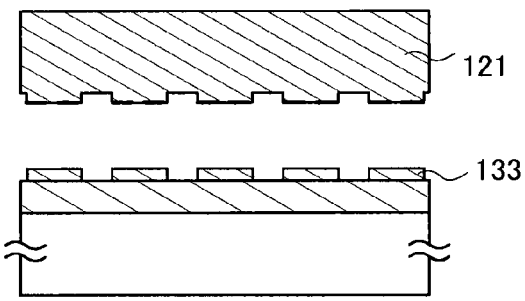

The single crystal semiconductor substrate 101 is separated along the fragile layer 103 formed in the single crystal semiconductor substrate 101, here, in the projecting portions 244. The single crystal semiconductors 133 are formed partly over the supporting substrate 111 with the buffer layer 225 provided therebetween (FIG. 6D).

In the single crystal semiconductor substrate 101, the projecting portions 244 are bonding to the buffer layer 225. Therefore, in the separation step of the single crystal semiconductor substrate 101 using heat treatment or the like, the projecting portions 244 can be selectively left on the buffer layer 225.

Through the above steps, the single crystal semiconductors 133 can be formed on parts of the buffer layer.

Note that in the methods for forming the single crystal semiconductors 133 on parts of the buffer layer described in FIGS. 3A-1 and 3A-2 and FIGS. 3B to 3F, FIGS. 4A-1 and 4A-2 and FIGS. 4B to 4D, FIGS. 5A-1 and 5A-2 and FIGS. 5B to 5D, and FIGS. 6A-1 and 6A-2 and FIGS. 6B to 6D, the single crystal semiconductor substrate 121 from which the single crystal semiconductors 133 are separated can be repeatedly used. The single crystal semiconductor substrate 121 is subjected to reprocessing treatment as appropriate. Examples of the reprocessing treatment include etching for removing a damaged region and laser beam irradiation for improving the crystallinity. The single crystal semiconductor substrate 121 may be used as the single crystal semiconductor substrate 101 in this embodiment, or may be used for another purpose.

The amount of the single crystal semiconductor used for the SOI substrate manufactured in this embodiment is smaller than that of the single crystal semiconductor used for an SOI substrate obtained by a bonding method using a Smart Cut (registered trademark) method. As a result, resource saving and cost reduction can be achieved.

In the case where the single crystal semiconductor substrate is separated by using ion irradiation and the fragile layer formed by the ion irradiation, an accelerating voltage, a voltage applied for accelerating ions, is lowered, or an insulating layer (such as a buffer layer or a protection layer) through which elements included in the ions pass is formed to be thick, whereby the fragile layer can be formed at a shallow depth of the single crystal semiconductor substrate. Accordingly, a single crystal semiconductor layer separated from the single crystal semiconductor substrate can be made thin. However, it is difficult to form a fragile layer having a uniform thickness at a shallow depth of a single crystal semiconductor substrate. When the single crystal semiconductor layer separated from the single crystal semiconductor substrate is made thin, defects are likely to occur: for example, a portion where the single crystal semiconductor substrate cannot be separated is generated, and a hole is formed in the single crystal semiconductor layer after the separation. As thinner the thickness of the single crystal semiconductor layer becomes, for example, 100 nm or less, 50 nm or less, and further 30 nm or less, more defects are likely to occur. When a display device is manufactured, if a hole exists in a single crystal semiconductor layer, a transistor having a defect is formed due to the hole, which could cause a fatal defect in which a pixel does not function. By forming the amorphous semiconductor layer over the single crystal semiconductors separated from the single crystal semiconductor substrate and crystallizing the amorphous semiconductor layer as in this embodiment, a semiconductor layer having an excellent crystallinity without a defect such as a hole can be obtained. Moreover, because the dose of ions can be decreased, the productivity can also be improved.

Note that the structure described in this embodiment can be combined as appropriate with any structure described in the other embodiments in this specification.

Embodiment 2

In this embodiment, a method for manufacturing an SOI substrate which is different from that described in the above embodiment is described. The method is described below with reference to FIGS. 7A to 7C.

The buffer layer 105 is formed on the supporting substrate 111, and a non-single crystal semiconductor layer 341 is formed on the buffer layer 105. The single crystal semiconductors 133 are formed on parts of the non-single crystal semiconductor layer 341 (FIG. 7A).

Figure 7A:
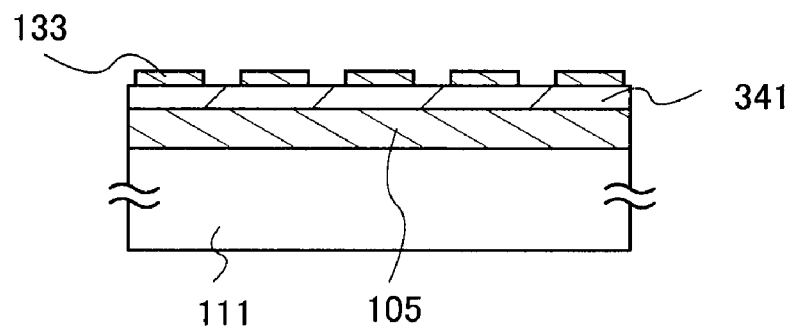
FIGS. 7A to 7C are diagrams illustrating a method for manufacturing an SOI substrate according to one embodiment of the present invention.
Figure 7B:
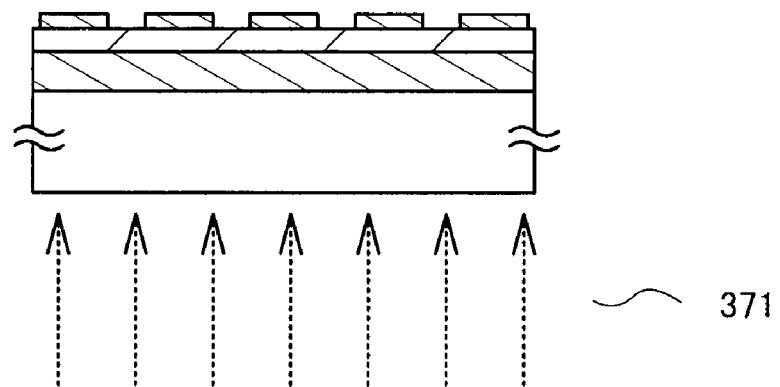
Figure 7C:
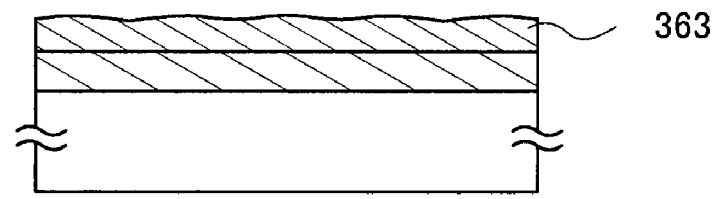

Next, the non-single crystal semiconductor layer 341 is crystallized by irradiation with a laser beam 371 (FIG. 7B) to form a crystalline semiconductor layer 363 (FIG. 7C). The crystalline semiconductor layer 363 is formed over the supporting substrate 111 with the buffer layer 105 provided therebetween, whereby an SOI substrate can be manufactured.

The difference of FIGS. 7A to 7C of this embodiment from FIGS. 2A to 2C of Embodiment 1 described above is that the single crystal semiconductor layers are formed on the non-single crystal semiconductor layer 341. In order to obtain the structure illustrated in FIG. 7A, the following methods are given: in FIG. 3A-1 and FIG. 4A-1, the formation of the buffer layer 105 is performed after the non-single crystal semiconductor layer 341 is formed on the single crystal semiconductor substrate 101; in FIG. 5B and FIG. 6B, the formation of the buffer layer 225 on the supporting substrate 111 is conducted, and then the non-single crystal semiconductor layer 341 is formed on the buffer layer 225; and the like. The non-single crystal semiconductor layer 341 may be formed in a manner which is the same as or similar to that of the non-single crystal semiconductor layer 141 in FIG. 2B.

Note that in the case of attaching (bonding) the non-single crystal semiconductor layer 341 and the single crystal semiconductors 133, either/both of the surfaces to be attached is/are preferably subjected to activation treatment. Specifically, activation treatment using an argon gas (an Ar gas), such as plasma irradiation, radical irradiation, atom beam irradiation, or ion beam irradiation is preferably performed.

FIG. 7B illustrates an example of irradiation with the laser beam 371 from the supporting substrate 111 side. Although the direction of the laser beam is not limited as long as the non-single crystal semiconductor layer 341 is irradiated with the laser beam, it is preferable that the single crystal semiconductors 133 be not completely melted. In this embodiment, because the position of the non-single crystal semiconductor layer 341 is under the single crystal semiconductors 133, the non-single crystal semiconductor layer 341 can be efficiently crystallized by the laser beam irradiation from the supporting substrate 111 side. The single crystal semiconductors 133 serve as seed crystals and the non-single crystal semiconductor layer 341 can be crystallized with almost or substantially uniform crystal orientations.

Note that a step caused by forming the single crystal semiconductors 133 on the non-single crystal semiconductor layer 341 can be planarized by the irradiation with the laser beam 371 for crystallizing the non-single crystal semiconductor layer 341. When the step is not sufficiently planarized, as needed, etching, irradiation with a laser beam, CMP treatment, or the like may be performed as appropriate. Alternatively, the step may be left and the difference of the thicknesses may be used for manufacturing components whose usages are different. The difference of the thicknesses can be used when components whose usages are different are formed over the same substrate.

Note that the structure described in this embodiment can be combined as appropriate with any structure described in the other embodiments in this specification.

Embodiment 3

In this embodiment, a method for manufacturing an SOI substrate which is different from that described in the above embodiments is described. The method is described below with reference to FIGS. 8A-1 and 8A-2 and FIGS. 8B to 8F.

The single crystal semiconductor substrate 101 is prepared (FIG. 8A-1), the buffer layer 105 is formed on the single crystal semiconductor substrate 101, and a fragile layer 403 is formed in the single crystal semiconductor substrate 101 (FIG. 8A-2). The supporting substrate 111 is also prepared (FIG. 8B).

The single crystal semiconductor substrate 101 and the supporting substrate 111 are attached with the buffer layer provided therebetween (FIG. 8C).

The single crystal semiconductor substrate 101 is separated along the fragile layer 403, and then a cluster-shape single crystal semiconductor 433 is formed over the supporting substrate 111 with the buffer layer 105 provided therebetween (FIG. 8D).

Here, the "cluster" refers to a structural unit including a plurality of atoms or molecules. For example, silicon with a cluster shape is formed on the buffer layer 105 by using a silicon substrate as the single crystal semiconductor substrate 101.

The cluster-shape single crystal semiconductor 433 is formed, for example, as follows: the fragile layer 403 is formed in an extremely shallow region from the surface of the single crystal semiconductor substrate 101, and the single crystal semiconductor substrate 101 is separated by heat treatment or the like. Note that the single crystal semiconductor 433 may be a continuous layer having a thickness of 100 nm or less, 50 nm or less, 30 nm or less, or a continuous ultrathin layer (e.g., a monatomic layer) instead of having the cluster shape. Examples of a method for forming the fragile layer 403 in an extremely shallow region are as follows: the single crystal semiconductor substrate 101 is irradiated with ions through a thick insulating layer (such as a buffer layer or a protection layer); the dose of ions is decreased.

A non-single crystal semiconductor layer 441 is formed over the cluster-shape single crystal semiconductor 433, and then irradiated with a laser beam 471 to be crystallized (see FIG. 8E); in this manner, a crystalline semiconductor layer 463 is formed (FIG. 8F). Through the above steps, the crystalline semiconductor layer 463 is formed over the supporting substrate 111, so that the SOI substrate can be manufactured.

The non-single crystal semiconductor layer 441 may be formed in a manner which is the same as or similar to that of the non-single crystal semiconductor layer 141 in FIG. 2B. After the formation of the non-single crystal semiconductor layer on the buffer layer as in Embodiment 2, the cluster-shape single-crystal semiconductor may be formed on the non-single crystal semiconductor layer. The irradiation with the laser beam 471 may be conducted in a manner which is the same as or similar to that of the irradiation with the laser beam 171.

Note that a step caused by stacking the non-single crystal semiconductor layer 441 over the single crystal semiconductor 433 can be planarized by the irradiation with the laser beam 471 for crystallizing the non-single crystal semiconductor layer 441. When the step is not sufficiently planarized, as needed, etching, irradiation with a laser beam, CMP treatment, or the like may be performed as appropriate.

By employing the cluster-shape single crystal semiconductor as in this embodiment, the amount of the single crystal semiconductor separated from the single crystal semiconductor substrate in one step is reduced; accordingly, resource saving and cost reduction can be achieved. The amount of the single crystal semiconductor left on the single crystal semiconductor substrate is increased, whereby the number of times of reusing the substrate is also increased. As a result, an inexpensive SOI substrate can be provided.

Moreover, when the depth of the fragile layer 403 from the surface of the single crystal semiconductor substrate is made extremely shallow in the process of forming the cluster-shape single crystal semiconductor, patterning using a photolithography technique or an etching technique is not necessary; thus, the process is facilitated and the productivity is improved.

Further, since the thickness of the cluster-shape single crystal semiconductor can be thinner than that of a continuous layer of single crystal semiconductor, the flatness of the crystalline semiconductor layer, obtained by forming the non-single crystal semiconductor layer over the cluster-shape single crystal semiconductor to be crystallized, can be preferable.

Note that the structure described in this embodiment can be combined as appropriate with any structure described in the other embodiments in this specification.

Embodiment 4

In this embodiment, a method for manufacturing an SOI substrate which is different from that described in the above embodiments is described.

In this embodiment, an example where single crystal semiconductors serving as seed crystals are efficiently separated from one single crystal semiconductor substrate to form SOI substrates is described. Here, an example of separating single crystal semiconductors serving as seed crystals from one substrate, that is, a plurality of rectangle-shape (strip-shape) single crystal semiconductors is separated from one single crystal semiconductor substrate, is described. Each of the rectangle-shape single crystal semiconductors separated from one single crystal semiconductor substrate is preferably formed over each of a plurality of supporting substrates.

Note that an example of separating rectangle-shape single crystal semiconductors is described in this embodiment, but there is no particular limitation on the shape of the single crystal semiconductors as long as the single crystal semiconductor substrate can be used without waste. It is preferable that a plurality of single crystal semiconductors be separated and the flatness of a surface of the single crystal semiconductor substrate (a separation plane) left after the separation be high. When the flatness of the surface of the single crystal semiconductor substrate left after the separation is high, the substrate can be easily reused or used for another purpose, treatment for reusing can be performed easy, and the waste can be reduced. When the rectangle-shape (strip-shape) is employed as the shape of the single crystal semiconductors separated from the single crystal semiconductor substrate, the single crystal semiconductor substrate with a flat surface can be left after the separation easily and without waste.

In one mode of this embodiment, an SOI substrate is manufactured by conducting a step A in which a supporting substrate and a single crystal semiconductor substrate are prepared, and a rectangle-shape single crystal semiconductor separated from the single crystal semiconductor substrate is formed over the supporting substrate with a buffer layer provided therebetween, and a step B in which a non-single crystal semiconductor layer is formed over the buffer layer on which the rectangle-shape single crystal semiconductor is formed, and irradiated with a laser beam to be crystallized using the rectangle-shape single crystal semiconductor as a seed crystal.

The steps A and B are conducted in a set, a plurality of sets is performed at the same time, or the set is repeated; thus, a plurality of SOI substrates is manufactured. In the plurality of steps A, the rectangle-shape single crystal semiconductors are each separated from one single crystal semiconductor substrate toward a plurality of supporting substrates, so that the single crystal semiconductors are formed over the respective supporting substrates with a buffer layer provided therebetween. The number of the supporting substrates is plural: on the other hand, the number of the single crystal semiconductor substrates can be reduced to one or less than the number of the supporting substrates.

In the plurality of steps A, it is preferable that the plurality of rectangle-shape single crystal semiconductors be separated from one single crystal semiconductor substrate, and the surface of the single crystal semiconductor substrate (the separation plane) left after the separation be made flat (substantially flat).

Specific description is made below with reference to drawings. First, an example of the step A is described using FIGS. 9A-1 to 9A-4 and 9B-1 to 9B-4.

In FIG. 9A-1, a single crystal semiconductor substrate 551 is prepared, and a fragile layer 553a is formed partly in the single crystal semiconductor substrate 551. Note that in FIG. 9A-1, an upper view is a simplified cross-sectional view and a lower view is a plan view.

Here, in order to form the fragile layer 553a partly in the single crystal semiconductor substrate 551, a mask 581a is formed. Ion irradiation for forming the fragile layer is blocked using the mask 581a so that the fragile layer 553a can be formed partly in the single crystal semiconductor substrate 551. In FIG. 9A-1, an example is illustrated in which the mask 581a is formed so that the edge portion of the single crystal semiconductor substrate 551 is exposed to have a rectangle-shape (a strip-shape in FIG. 9A-1). Note that the descriptions of the ion irradiation for forming the fragile layer 553a and a material of the single crystal semiconductor substrate 551 are the same as descriptions of the ion irradiation for forming the fragile layer 103 and the material of the single crystal semiconductor substrate 101, respectively. Although not illustrated here, a buffer layer (e.g., an insulating layer) may be formed on the single crystal semiconductor substrate 551 (between the single crystal semiconductor substrate 551 and the mask 581a).

As the mask 581a, a mask having resistance against ion irradiation is used. Specifically, an insulating layer such as a silicon oxide layer, a silicon nitride layer, a silicon oxynitride layer, or a silicon nitride oxide layer is preferably formed as a hard mask.

Although the mask 581a in which a block against ion irradiation is not provided in a region which allows ions to pass through (a region which allows ions to pass through is exposed) is exemplified here, a mask having different thicknesses (a step) can also be used. For example, a mask having a step between a region which allows ions to pass through and a region which prevents ions from passing through is used. In the mask, the thickness of the region which allows ions to pass through is made as thin as ions can pass through and the thickness of the region which prevents ions from passing through is made as thick as ions do not pass through. The regions to be the fragile layer are irradiated with ions which pass through the mask, so that the fragile layer 553a can be easily formed in a shallow region from the surface of the single crystal semiconductor substrate 551.

After the formation of the fragile layer 553a, the mask 581a which becomes unnecessary may be removed as appropriate by etching or the like. After the removal of the mask 581a, an insulating layer obtained by a chemical oxide, radical treatment, plasma treatment, or the like may be formed on the surface of the single crystal semiconductor substrate where a depressed portion is formed.

In FIG. 9B-1, a single crystal semiconductor 501a is attached to a supporting substrate 511a provided with a buffer layer 505a.

The single crystal semiconductor 501a may be formed in a manner which is the same as or similar to that of the single crystal semiconductors 133 described in Embodiment 1. In addition, the buffer layer 505a and the supporting substrate 511a are formed in a manner which is the same as or similar to that of the buffer layer 105 and the supporting substrate 111 described above, respectively. The supporting substrate 511a and the single crystal semiconductor substrate 551 are attached to each other with the buffer layer provided therebetween. The single crystal semiconductor 501a (here, a strip-shape single crystal semiconductor 501a) is separated from the single crystal semiconductor substrate 551 along the fragile layer 553a formed partly in the single crystal semiconductor substrate 551, and then the single crystal semiconductor 501a is bonded to the buffer layer 505a.

Note that a region in the single crystal semiconductor substrate 551 which is not attached to the supporting substrate 511a (a region which is not bonded to the buffer layer 505a) is preferably subjected to treatment in order not to be attached to the supporting substrate 511a. For example, when a surface of the region which is not subjected to bonding (a region except a region separated as the single crystal semiconductor 501a) has a hydrophobic property, and in contrast, a surface of the region where the fragile layer is formed (a region separated as the single crystal semiconductor 501a) has a hydrophilic property, a desired region can be attached to the supporting substrate 511a. Alternatively, the region subjected to attachment may be controlled by making a step in the single crystal semiconductor substrate 551 in order that the region which is not subjected to bonding is made to be a depressed portion and the region where the fragile layer is formed (a region which becomes the single crystal semiconductor 501a) is made to be a projecting portion. Further alternatively, by increasing the surface roughness of the region of the single crystal semiconductor substrate 551 which is not subjected to bonding, the region subjected to attachment may be controlled.

In FIG. 9B-1, the single crystal semiconductor 501a is separated from the single crystal semiconductor substrate 551, whereby a single crystal semiconductor substrate 551a can be obtained.

Next, the single crystal semiconductor substrate 551a in FIG. 9B-1 is used to form the fragile layer 553b partly in the single crystal semiconductor substrate 551a as in FIG. 9A-2. The fragile layer 553b is formed next to the region where the fragile layer 553a is formed in FIG. 9A-1, for example. A mask 581b is formed so that a region next to the region exposed in FIG. 9A-1 is exposed. Here, when it is difficult to make the side-surface of the mask 581b and the side-surface of a step portion of the single crystal semiconductor substrate 551a align with each other (form one face), the mask 581b may be formed to extend beyond the step portion of the single crystal semiconductor substrate 551a.

In FIG. 9B-2, a single crystal semiconductor 501b is attached to a supporting substrate 511b provided with a buffer layer 505b. The single crystal semiconductor 501b is separated from the single crystal semiconductor substrate 551a, whereby the single crystal semiconductor substrate 551b can be obtained.

Then, the single crystal semiconductor substrate 551b is used to form a fragile layer 553c partly in the single crystal semiconductor substrate 551b as in FIG. 9A-3. The fragile layer 553c is formed next to the region where the fragile layer 553b is formed in FIG. 9A-2 (a region opposite to the region where the fragile layer 553a is formed), for example. The mask 581c may be formed as shown in plan view of FIG. 9A-3. Here, when it is difficult to make the side-surface of the mask 581c and the side-surface of a step portion of the single crystal semiconductor substrate 551b align with each other (form one face), the mask 581c may be formed to cross the step portion of the single crystal semiconductor substrate 551b.

In FIG. 9B-3, a single crystal semiconductor 501c is attached to a supporting substrate 511c provided with a buffer layer 505c. The single crystal semiconductor 501c is separated from the single crystal semiconductor substrate 551b, whereby the single crystal semiconductor substrate 551c can be obtained.

Then, the single crystal semiconductor substrate 551c is used to form a fragile layer 553d partly in the single crystal semiconductor substrate 551c as in FIG. 9A-4. The fragile layer 553d is formed next to the region where the fragile layer 553c is formed in FIG. 9A-3 (a region opposite to the region where the fragile layer 553b is formed), for example. The mask 581d may be formed as shown in the plan view of FIG. 9A-4. Here, when it is difficult to make the side-surface of the mask 581d and the side-surface of a step portion of the single crystal semiconductor substrate 551c align with each other (form one face), the mask 581d may be formed to cross the step portion of the single crystal semiconductor substrate 551c.

In FIG. 9B-4, a single crystal semiconductor 501d is attached to a supporting substrate 511d provided with a buffer layer 505d. The single crystal semiconductor 501d is separated from the single crystal semiconductor substrate 551c, whereby a single crystal semiconductor substrate 551d can be obtained.

Note that the descriptions of the masks 581b, 581c, and 581d are the same as the description of the mask 581a. Instead of a mask in which a block against ion irradiation is not provided in a region which allows ions to pass through, a mask having a step can be used. By using a mask having a thin thickness of a region which allows ions to pass (a region where the fragile layer is formed) for forming the fragile layer, the fragile layer can be easily formed at a shallow depth from the surface of the single crystal semiconductor substrate.

The single crystal semiconductors are separated from the single crystal semiconductor substrate 551 in the above manner, whereby the single crystal semiconductor substrate can be used without waste. Specifically, the surface (the separation plane) of the single crystal semiconductor substrate 551d illustrated in FIG. 9B-4 is substantially flat. By the steps of FIGS. 9A-1 to 9A-4 and FIGS. 9B-1 to 9B-4, crystal seeds for four SOI substrates can be formed.

Note that an example in which the rectangle-shape single crystal semiconductor is separated and bonded to the buffer layer is described in FIGS. 9A-1 to 9A-4 and FIGS. 9B-1 to 9B-4, but there is no particular limitation on the shape of the single crystal semiconductor separated from the single crystal semiconductor substrate as long as the single crystal semiconductor substrate can be used without waste.

In addition, an example of forming crystal seeds for four SOI substrates is illustrated in FIGS. 9A-1 to 9A-4 and FIGS. 9B-1 to 9B-4, but the number of the single crystal semiconductors separated from one single crystal semiconductor substrate is not particularly limited. For example, the surface of the single crystal semiconductor substrate (the separation plane) may be made flat by separating two, three, five, or more single crystal semiconductors.

Figure 10A:
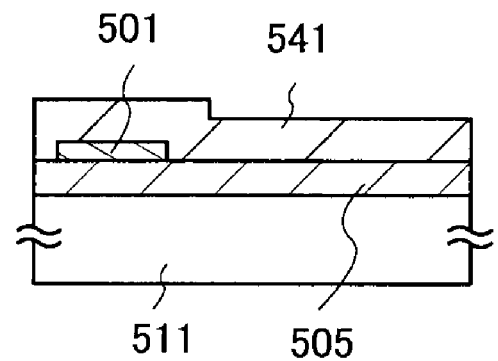
FIGS. 10A to 10C are diagrams illustrating a method for manufacturing an SOI substrate according to one embodiment of the present invention.
Figure 10B:
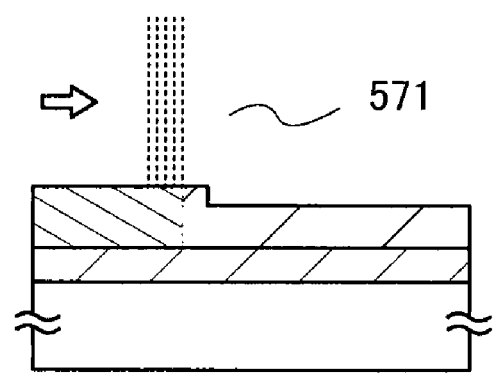
Figure 10C:
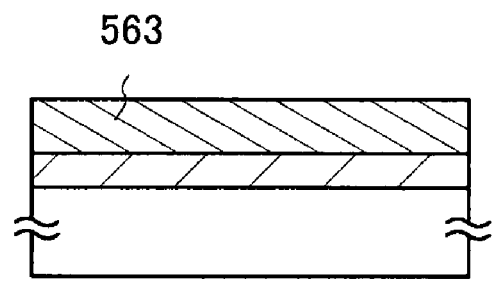

Next, the step B is described using FIGS. 10A to 10C. As in FIG. 10A, a non-single crystal semiconductor layer 541 is formed over the entire surface of the buffer layer 505 on which the single crystal semiconductor 501 is formed. Note that the single crystal semiconductor 501, the buffer layer 505, and the supporting substrate 511 each correspond to the single crystal semiconductors 501a to 501d, the buffer layers 505a to 505d, and the supporting substrates 511a to 511d, respectively, illustrated in FIGS. 9A-1 to 9A-4 and FIGS. 9B-1 to 9B-4.

The non-single crystal semiconductor layer 541 is crystallized by irradiating with a laser beam 571 as in FIG. 10B to form a crystalline semiconductor layer 563 as illustrated in FIG. 10C.

The non-single crystal semiconductor layer 541 may be formed in a manner which is the same as or similar to that of the non-single crystal semiconductor layer 141 or the like. After the formation of the non-single crystal semiconductor layer on the buffer layer as in Embodiment 2, the single crystal semiconductor 501a with a rectangle-shape or the like may be formed on the non-single crystal semiconductor layer.

The irradiation with the laser beam 571 may be performed in a manner which is the same as or similar to that of the irradiation with the laser beam 171, the laser beam 371, or the like, but irradiation with a laser beam providing a linearly irradiated area is preferably conducted since the single crystal semiconductor 501a with a rectangle-shape (also referred to as a linear-shape having an area) is formed as a seed crystal in FIGS. 9A-1 to 9A-4 and FIGS. 9B-1 to 9B-4. In FIG. 10B, an example of irradiation with the linear-shape laser beam 571 is illustrated, in which the laser beam 571 is scanned in a direction indicated by an outline arrow. When long-axis directions of the laser beam 571 providing a linearly irradiated area and the rectangle-shape single crystal semiconductor 501 are made to be aligned with each other and the laser beam 571 is scanned in a short-axis direction, the non-single crystal semiconductor layer 541 can be efficiently crystallized. Moreover, the crystal orientations are easily aligned and thus, a crystalline semiconductor layer 563 having a high crystallinity can be formed.

Through the above steps, the SOI substrate in which the crystalline semiconductor layer 563 is formed over the supporting substrate 511 can be manufactured.

Note that a step caused by forming the non-single crystal semiconductor layer 541 over the single crystal semiconductor 501 can be planarized by the irradiation with the laser beam 571 for crystallizing the non-single crystal semiconductor layer 541. When the step is not sufficiently planarized, as needed, etching, irradiation with a laser beam, CMP treatment, or the like may be performed as appropriate. Alternatively, the step may be left and the difference of the thicknesses may be used for manufacturing components whose usages are different. The difference of the thicknesses can be used when components whose usages are different are formed over the same substrate.

By separating the single crystal semiconductors from the single crystal semiconductor substrate without waste as in this embodiment, the amount of the single crystal semiconductor substrate used can be decreased; therefore, resource saving and cost reduction can be achieved. As in FIGS. 9A-1 to 9A-4, FIGS. 9B-1 to 9B-4, and FIGS. 10A to 10C, the rectangle-shape single crystal semiconductor is separated, and the non-single crystal semiconductor layer formed over the rectangle-shape single crystal semiconductor is crystallized using the linear-shape laser beam, whereby the crystal orientations of the non-single crystal semiconductor layer are easily aligned, which causes crystallization, so that a crystalline semiconductor layer having a high crystallinity can be formed.

Note that the structure described in this embodiment can be combined as appropriate with any structure described in the other embodiments in this specification.

Embodiment 5

In this embodiment, a method for manufacturing an SOI substrate which is different from that described in the above embodiments is described. An example of manufacturing an SOI substrate by forming a crystalline semiconductor layer over one large-area supporting substrate is described in this embodiment.

When single crystal semiconductors separated from a plurality of single crystal semiconductor substrates are attached to one supporting substrate, or when a single crystal semiconductor is repeatedly separated from one single crystal semiconductor substrate and attached to one supporting substrate, a crystalline semiconductor layer can be formed over one large-area supporting substrate. In this embodiment, the single crystal semiconductor or the like may be combined with that in any of the other embodiments. Specific description is made below with reference to FIGS. 11A to 11C.

Figure 11A:
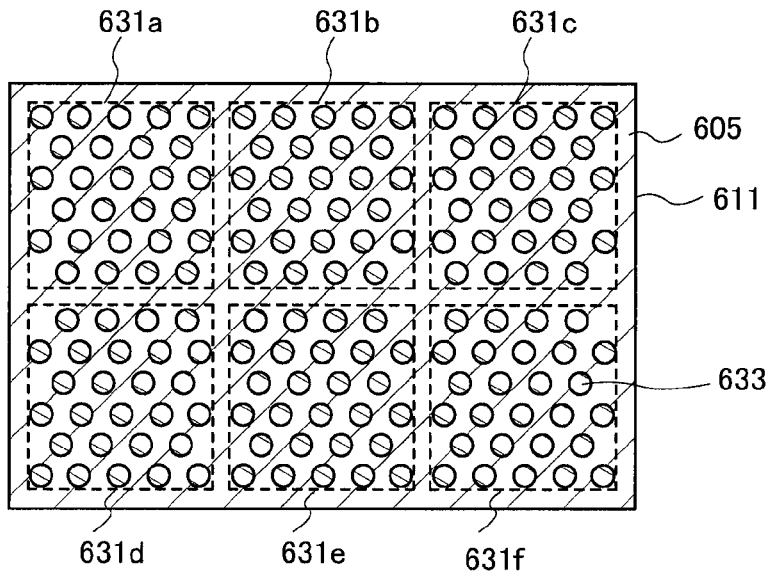
FIGS. 11A to 11C are diagrams illustrating a method for manufacturing an SOI substrate according to one embodiment of the present invention.

In FIG. 11A, single crystal semiconductor groups 631a, 631b, 631c, 631d, 631e, and 631f are formed over one supporting substrate 611. The single crystal semiconductor groups 631a to 631f are each separated from one single crystal semiconductor substrate, and bonded to a buffer layer 605 on the supporting substrate 611. Single crystal semiconductors 633 separated from a plurality of single crystal semiconductor substrates are formed over one supporting substrate 611.

A large-area substrate can be used as the supporting substrate 611. As the supporting substrate 611, for example, a mother glass substrate which has been developed for manufacturing liquid crystal panels is preferably used. Substrates with the following sizes are known as mother glass substrates, for example: 3rd generation (550 mm×650 mm), 3.5th generation (600 mm×720 mm), 4th generation (680 mm×880 mm or 730 mm×920 mm), 5th generation (1100 mm×1300 mm), 6th generation (1500 mm×1850 mm), 7th generation (1870 mm×2200 mm), 8th generation (2200 mm×2400 mm), and the like. Using such a large-area substrate as the supporting substrate 611 allows an SOI substrate to have a large area.

Figure 11B:
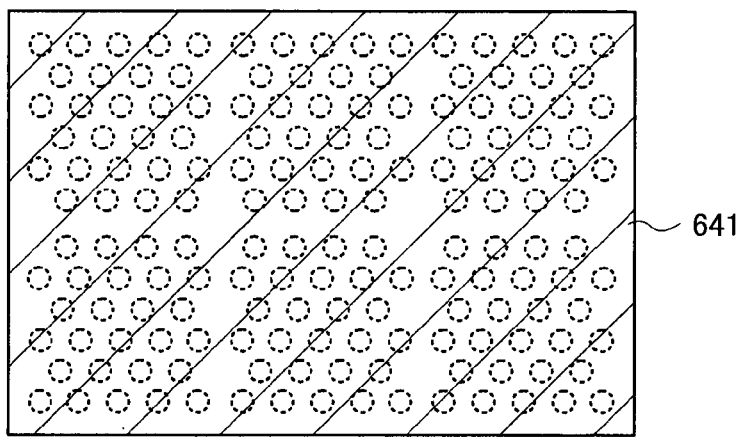
Figure 11C:
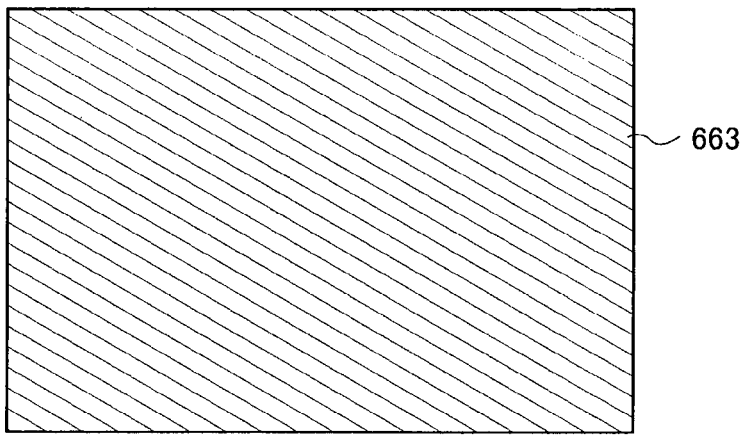

A plurality of single crystal semiconductors 633 is formed over the supporting substrate 611 with the buffer layer 605 provided therebetween. In FIGS. 11A to 11C, an example of forming the single crystal semiconductors 633 on the buffer layer to make a dot-pattern as in Embodiment 1 is illustrated, but the single crystal semiconductors 633 may be formed on the non-single crystal semiconductor layer after the formation of the non-single crystal semiconductor layer on the buffer layer as in Embodiment 2. Alternatively, the cluster-shape single crystal semiconductor may be formed as described in Embodiment 3. Further alternatively, as in Embodiment 4, a plurality of rectangle-shape single crystal semiconductors, which is separated from one single crystal semiconductor substrate, may be sequentially placed as the single crystal semiconductor groups 631a to 631d over one large-area supporting substrate, so that the single crystal semiconductor substrate is used without waste.

In FIG. 11B, a non-single crystal semiconductor layer 641 is formed on the entire surface of the buffer layer 605 on which the plurality of single crystal semiconductors 633 (single crystal semiconductor groups 631a to 631d) is formed. When the non-single crystal semiconductor layer 641 is irradiated with a laser beam to be crystallized, a large-area crystalline semiconductor layer 663 illustrated in FIG. 11C can be formed. Through the above steps, the large-area SOI substrate can be manufactured.

In the case of using a large-area substrate as the supporting substrate as in this embodiment, the non-single crystal semiconductor layer provided on the upper or lower layer of the single crystal semiconductors is crystallized; accordingly, the large-area SOI substrate can be manufactured, which includes a crystalline semiconductor layer having a high crystallinity and less defects such as a hole. Moreover, since the large-area SOI substrate can be easily manufactured, SOI substrates can be provided inexpensively.

Note that the structure described in this embodiment can be combined as appropriate with any structure described in the other embodiments in this specification.

Embodiment 6

In this embodiment, an example of manufacturing a semiconductor element by using an SOI substrate is described. Here, an example where an n-channel field-effect transistor and a p-channel transistor are manufactured as semiconductor elements is described with reference to cross-sectional views in FIGS. 12A to 12E, FIGS. 13A and 13B, and FIGS. 14A to 14C.

First, an SOI substrate manufactured in a manner of the above embodiments or the like is prepared. For example, the SOI substrate obtained in Embodiment 1 is used. The SOI substrate in which the crystalline semiconductor layer 163 is formed over the supporting substrate 111 with the buffer layer 105 provided therebetween is prepared.

A p-type impurity element such as boron, aluminum, or gallium or an n-type impurity element such as phosphorus or arsenic are preferably added into the crystalline semiconductor layer 163 in accordance with formation regions of an n-channel field-effect transistor and a p-channel field-effect transistor. For example, a p-type impurity element is added into a formation region of an n-channel field-effect transistor and an n-type impurity element is added into a formation region of a p-channel field-effect transistor, whereby so-called well regions are formed. The dose of impurity ions may be approximately $1\times10^{12}$ ions/cm$^2$ to $1\times10^{14}$ ions/cm$^2$. Further, in the case of controlling the threshold voltage of the field-effect transistor, an n-type or a p-type impurity element may be added into the well region.

Figure 12A:
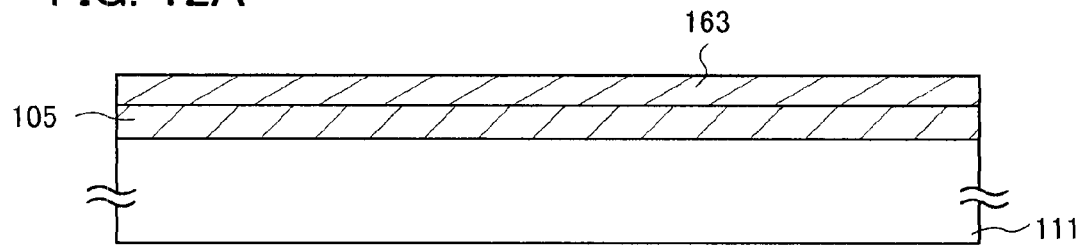
FIGS. 12A and 12E are diagrams illustrating a method for manufacturing a semiconductor device according to one embodiment of the present invention.
Figure 12B:
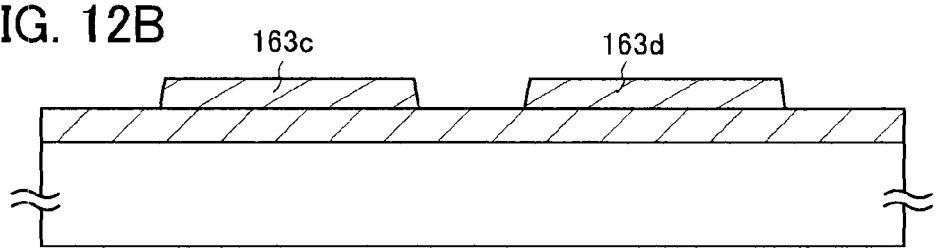

Then, as illustrated in FIG. 12B, the crystalline semiconductor layer 163 is etched to form a crystalline semiconductor layer 163c and a crystalline semiconductor layer 163d which are isolated in island shapes from each other in accordance with the arrangement of the semiconductor elements. In this embodiment, an n-channel field-effect transistor is formed using the crystalline semiconductor layer 163c, and a p-channel field-effect transistor is formed using the crystalline semiconductor layer 163d.

Figure 12C:
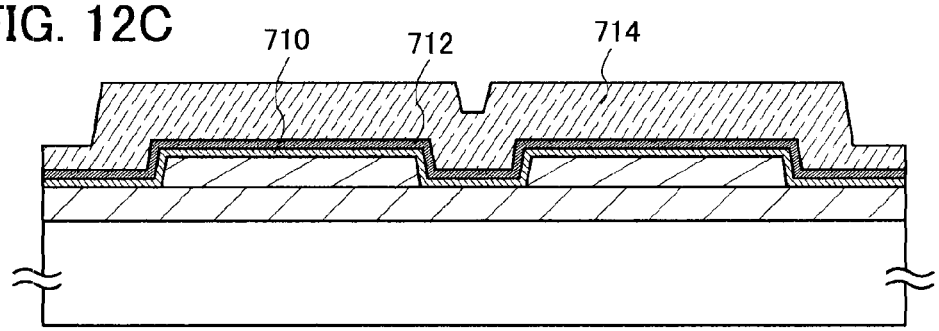

Next, as illustrated in FIG. 12C, a gate insulating layer 710, a conductive layer 712 for forming gate electrodes, and a conductive layer 714 are formed in this order over the crystalline semiconductor layer 163c and the crystalline semiconductor layer 163d.

The gate insulating layer 710 is formed to have a single layer structure or a stacked-layer structure using an insulating layer such as a silicon oxide layer, a silicon oxynitride layer, a silicon nitride layer, or a silicon nitride oxide layer by a CVD method, a sputtering method, an ALE method, or the like.

Alternatively, the gate insulating layer 710 may be formed by performing plasma treatment on the crystalline semiconductor layers 163c and 163d to oxidize or nitride the surfaces thereof. The plasma treatment in this case includes plasma treatment with plasma excited using microwaves (typically, with a frequency of 2.45 GHz). For example, treatment with plasma excited by microwaves and has an electron density of $1\times10^{11}$/cm$^3$ to $1\times10^{13}$/cm$^3$ inclusive and an electron temperature of 0.5 eV to 1.5 eV inclusive is also included. Oxidation treatment or nitridation treatment of the surface of the semiconductor layer with such plasma treatment makes it possible to form a thin and dense film. In addition, because the surface of the semiconductor layer is directly oxidized, a film with good interface characteristics can be obtained. Further alternatively, the gate insulating layer 710 may be formed by performing plasma treatment with microwaves on a film formed by a CVD method, a sputtering method, or an ALE method.

Since the gate insulating layer 710 forms an interface with the semiconductor layer, the gate insulating layer 710 is preferably formed so that a silicon oxide layer or a silicon oxynitride layer be an interface. This is because, in the case where a film in which the amount of nitrogen is higher than that of oxygen such as a silicon nitride layer or a silicon nitride oxide layer is formed, problems of interface characteristics such as generation of trap levels might be caused.

The conductive layer for forming gate electrodes is formed to have a single layer structure or a stacked-layer structure using a conductive material, such as an element selected from tungsten, tantalum, titanium, molybdenum, aluminum, copper, chromium, niobium, and the like, or an alloy or compound material containing the element, by a CVD method or a sputtering method. In addition, a semiconductor material typified by polycrystalline silicon doped with an impurity element such as phosphorus can also be used as the conductive layer for forming gate electrodes. In the case where the conductive layer has a stacked-layer structure, the stacked layers can be formed using various conductive materials or one conductive material. In this embodiment, an example is described in which the conductive layer for forming gate electrodes is formed to have a two-layer structure of the conductive layer 712 and the conductive layer 714.

When the gate electrodes are formed using a two-layer structure of the conductive layer 712 and the conductive layer 714 in this embodiment, a stacked-layer structure of a tantalum nitride layer and a tungsten layer, a titanium nitride layer and a tungsten layer, a molybdenum nitride layer and a molybdenum layer, or the like can be formed, for example. The stacked-layer structure of the tantalum nitride layer and the tungsten layer is preferably formed because etching rates of both layers are easily differentiated from each other and high selectivity of etching between the two layers can be obtained. Note that in the two-layer structure which is exemplified, the first mentioned layer is preferably formed over and in contact with the gate insulating layer 710. For example, the conductive layer 712 is formed with a thickness of 20 nm to 100 nm and the conductive layer 714 is formed with a thickness of 100 nm to 400 nm. The gate electrode can also have a stacked-layer structure of three or more conductive layers.

Next, a resist mask 720c and a resist mask 720d are selectively formed over the conductive layer 714. Then, first etching treatment and second etching treatment are performed using the resist masks 720c and 720d, respectively.

Figure 12D:
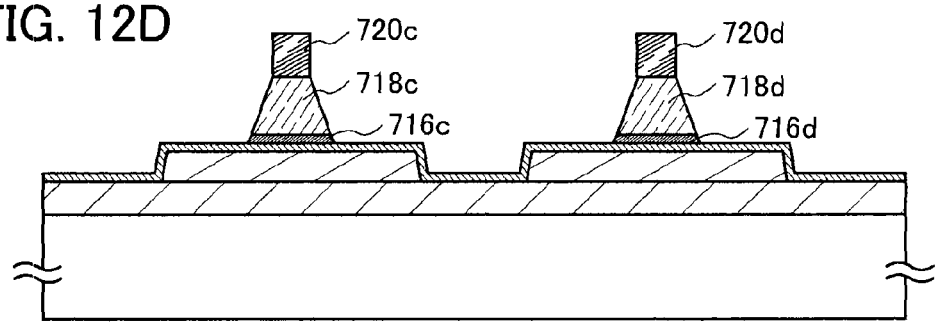

First, by the first etching treatment using the resist masks 720c and 720d, the conductive layers 712 and 714 are etched, and thus a conductive layer 716c and 718c and conductive layers 716d and 718d are formed over the crystalline semiconductor layers 163c and 163d, respectively (see FIG. 12D).

Figure 12E:
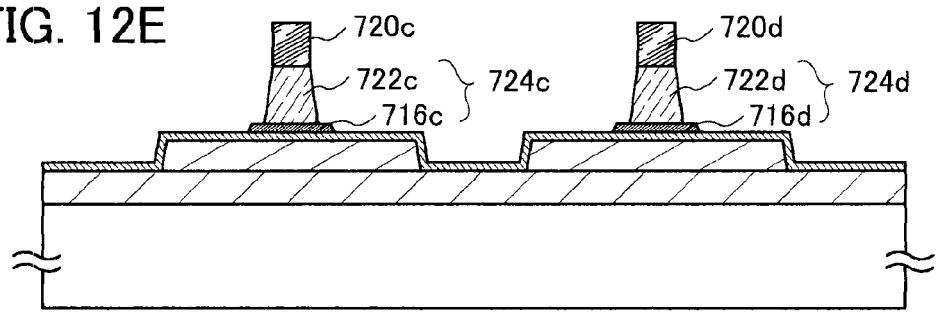
Figure 13A:
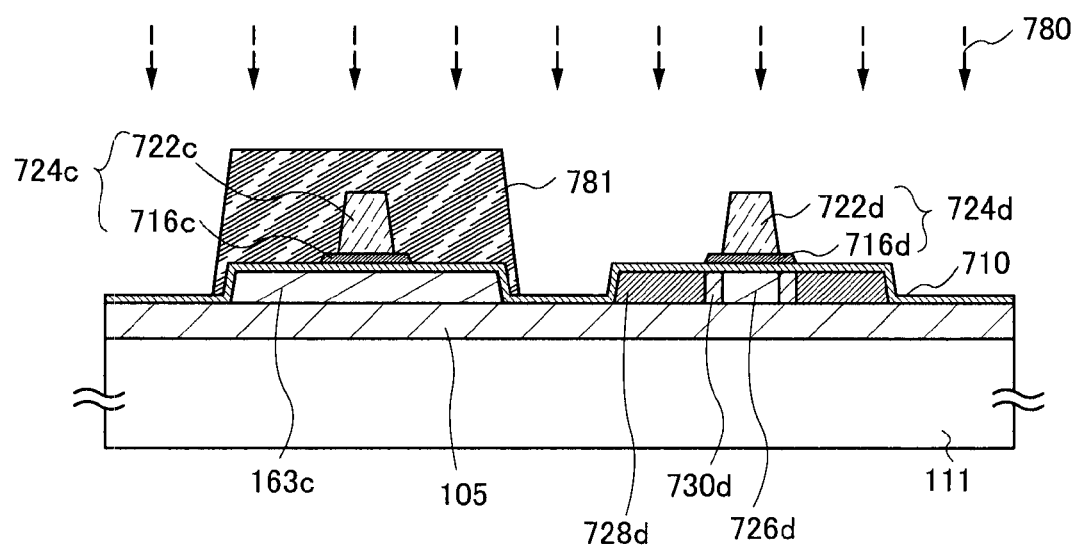
FIGS. 13A and 13B are diagrams illustrating a method for manufacturing a semiconductor device according to one embodiment of the present invention.
Figure 13B:
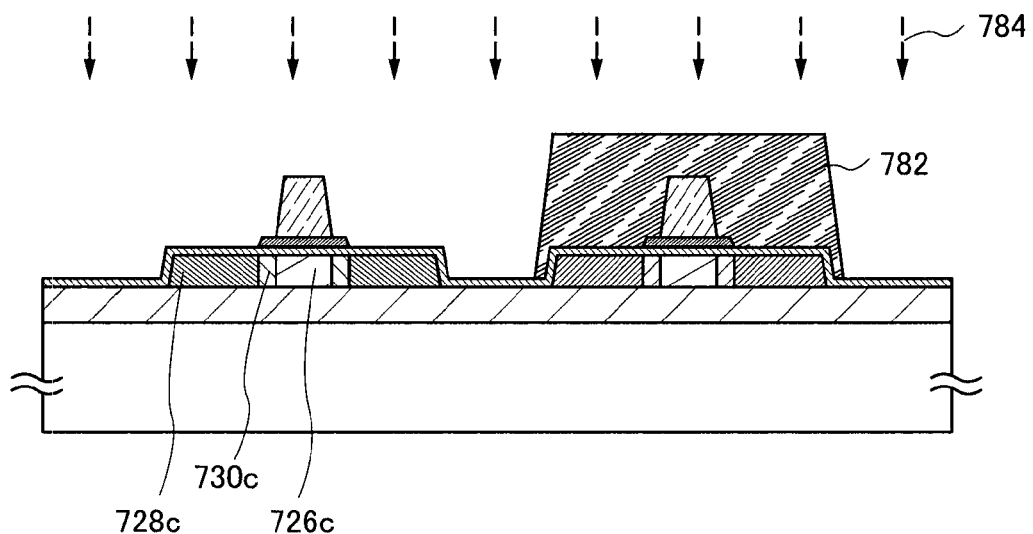

Next, by the second etching treatment using the resist masks 720c and 720d, end portions of the conductive layers 718c and 718d are etched, and thus a conductive layer 722c and a conductive layer 722d are formed (see FIG. 12E). The conductive layers 722c and 722d are formed so as to have smaller widths (lengths parallel to a direction in which carriers flow through channel formation regions (a direction in which a source region and a drain region are connected)) than those of the conductive layers 716c and 716d. In this manner, a gate electrode 724c having a two-layer structure of the conductive layers 716c and 722c and a gate electrode 724d having a two-layer structure of the conductive layers 716d and 722d are formed.

An etching method employed for the first etching treatment and the second etching treatment may be selected as appropriate. In order to increase etching rate, it is preferable to use a dry etching apparatus using a high-density plasma source such as an electron cyclotron resonance (ECR) source or an inductively coupled plasma (ICP) source. With appropriate control of the etching conditions (power applied to a coiled electrode or a parallel-plate electrode, power applied to an electrode on the substrate side, the temperature of the electrode on the substrate side, and the like) of the first etching treatment and the second etching treatment, side surfaces of the conductive layers 716c and 716d and the conductive layers 722c and 722d can each have a desired tapered shape. The resist masks 720c and 720d may be removed after the desired gate electrodes 724c and 724d are formed.

Next, a resist mask 781 is selectively formed to cover the crystalline semiconductor layer 163c. Then, an impurity element 780 is added into the crystalline semiconductor layer 163d using the resist mask 781 as a mask. In the crystalline semiconductor layer 163d, a pair of first impurity regions 728d, a pair of second impurity regions 730d, and a channel formation region 726d are formed in a self-aligning manner using the conductive layer 716d and the conductive layer 722d as masks (see FIG. 13A).

As the impurity element 780, a p-type impurity element such as boron, aluminum, or gallium or an n-type impurity element such as phosphorus or arsenic is added. Here, in order to form a p-channel field-effect transistor, boron that is a p-type impurity element is added as the impurity element 780. Further, boron is contained in the first impurity regions 728d at a concentration of approximately $1 \times 10^{20}$ atoms/cm$^3$ to $5 \times 10^{21}$ atoms/cm$^3$. The first impurity regions 728d serve as a source region and a drain region.

In the crystalline semiconductor layer 163d, the first impurity regions 728d are formed in regions which do not overlap the conductive layer 716d, the second impurity regions 730d are formed in regions which overlap the conductive layer 716d and do not overlap the conductive layer 722d, and the channel formation region 726d is formed in a region which overlaps the conductive layer 722d. The impurity concentration of the second impurity regions 730d is lower than that of the first impurity regions 728d.

A resist mask 782 is selectively formed to cover the crystalline semiconductor layer 163d after the resist mask 781 is removed. Then, an impurity element 784 is added into the crystalline semiconductor layer 163c using the resist mask 782 as a mask. In the crystalline semiconductor layer 163c, a pair of third impurity regions 728c, a pair of fourth impurity regions 730c, and a channel formation region 726c are formed in a self-aligning manner using the conductive layer 716c and the conductive layer 722c as masks (see FIG. 13B).

Here, in order to form an n-channel field-effect transistor, an n-type impurity element is added as an impurity element 784. For example, phosphorus is added as the impurity element 784 so as to be contained in the third impurity regions 728c at a concentration of approximately $5 \times 10^{19}$ atoms/cm$^3$ to $5 \times 10^{20}$ atoms/cm$^3$. The third impurity regions 728c serve as a source region and a drain region.

In the crystalline semiconductor layer 163c, the third impurity regions 728c are formed in regions which do not overlap the conductive layer 716c, the fourth impurity regions 730c are formed in regions which overlap the conductive layer 716c and do not overlap the conductive layer 722c, and the channel formation region 726c is formed in a region which overlaps the conductive layer 722c. The impurity concentration of the fourth impurity regions 730c is lower than that of the third impurity regions 728c.

Note that the order of forming the first impurity regions 728d, the second impurity regions 730d, and the channel formation region 726d in the crystalline semiconductor layer 163d and the order of forming the third impurity regions 728c, the fourth impurity regions 730c, and the channel formation region 726c in the crystalline semiconductor layer 163c are not limited to the order described in this embodiment, and may be changed as appropriate. Further, after the formation of the impurity regions (the first impurity regions 728d to the fourth impurity regions 730c) in the crystalline semiconductor layers 163c and 163d, the impurity regions are activated (reduced in resistance) by performing heat treatment, irradiation with a laser beam, or the like, as appropriate.

Next, an insulating layer covering the gate electrodes 724c and 724d, and the gate insulating layer 710 is formed to have a single layer structure or a stacked-layer structure. In the gate insulating layer 710 and the insulating layer formed thereover, contact holes connected to the pair of third impurity regions 728c formed in the crystalline semiconductor layer 163c and contact holes connected to the pair of the first impurity regions 728d formed in the crystalline semiconductor layer 163d are formed. In the contact holes, a conductive layer 736c and a conductive layer 736, each serving as a source electrode or a drain electrode, are formed (see FIG. 14C).

Figure 14A:
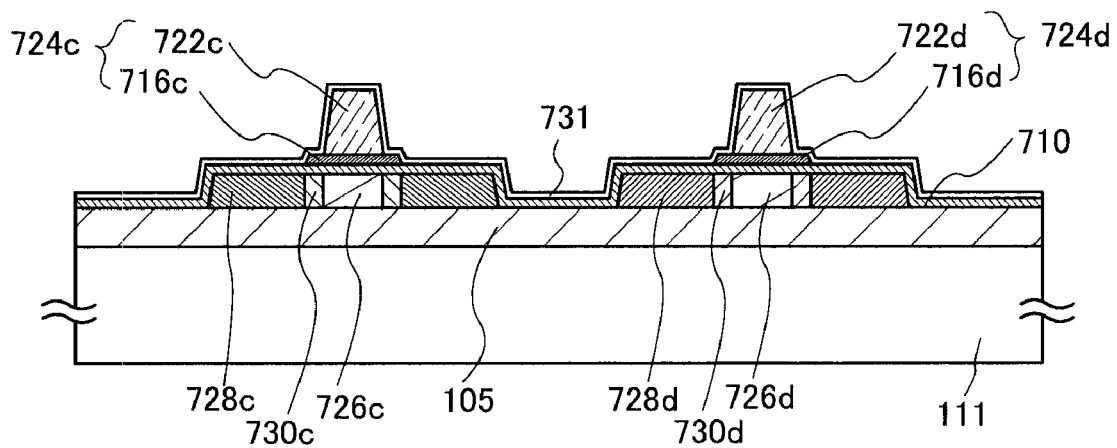
FIGS. 14A to 14C are diagrams illustrating a method for manufacturing a semiconductor device according to one embodiment of the present invention.

First, an insulating layer 731 covering the gate electrodes 724c and 724d and the gate insulating layer 710 is formed (see FIG. 14A). As the insulating layer 731, a silicon oxide layer, a silicon oxynitride layer, a silicon nitride layer, a silicon nitride oxide layer, or the like may be formed by a CVD method or a sputtering method. For example, a silicon oxynitride layer (thickness: 50 nm) is formed by a plasma CVD method as the insulating layer 731. Next, the impurity regions (the first impurity regions 728d to the fourth impurity regions 730c) can be activated by performing heat treatment at greater than or equal to 400° C. and less than or equal to a strain point of the supporting substrate 111. For example, heat treatment is performed at 480° C. for 1 hour in a nitrogen atmosphere. Performing heat treatment after the formation of the insulating layer 731 can prevent oxidation of the gate electrodes due to the heat treatment. Note that by controlling the atmosphere in the heat treatment, oxidation of the gate electrodes can be prevented without the formation of the insulating layer 731.

Figure 14B:
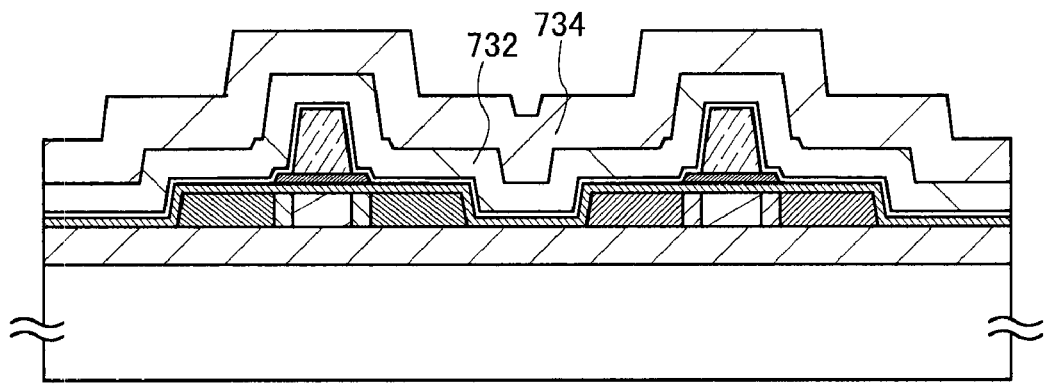

Next, an insulating layer 732 and an insulating layer 734 are formed over the insulating layer 731 (see FIG. 14B).

As the insulating layers 732 and 734, a silicon oxide layer, a silicon oxynitride layer, a silicon nitride layer, a silicon nitride oxide layer, or the like can be formed by a CVD method or a sputtering method. Alternatively, the interlayer insulating layers can also be formed by an application method such as a spin coating method, using an organic material such as polyimide, polyamide, polyvinylphenol, benzocyclobutene, acrylic, or epoxy; a siloxane material such as a siloxane resin; an oxazole resin; or the like. Note that a siloxane material corresponds to a material including a Si—O—Si bond.

Note that it is preferable that at least one layer of an insulating layer containing hydrogen be formed as the insulating layer formed over the gate electrodes 724c and 724d, and dangling bonds existing in the crystalline semiconductor layers be terminated with the hydrogen by heat treatment. When heat treatment at a temperature of greater than or equal to 350° C. and less than or equal to 480° C., preferably greater than or equal to 400° C. and less than or equal to 450° C. is performed after the formation of the insulating layer containing hydrogen, hydrogen contained in the insulating layer is thermally excited by the heat treatment and diffused. Accordingly, the hydrogen passes through the insulating layers and reaches the crystalline semiconductor layers. Then, dangling bonds in the crystalline semiconductor layers are terminated with the hydrogen. Since dangling bonds in a semiconductor layer, particularly in a channel formation region may adversely affect electric characteristics of a manufactured transistor, hydrogen termination as in this embodiment is effective. Hydrogen termination can improve interface characteristics between the gate insulating layer and the crystalline semiconductor layers.

The insulating layer containing hydrogen can be formed by a plasma CVD method using a process gas containing hydrogen. Even when the insulating layer containing hydrogen is not formed, heat treatment performed in an atmosphere containing hydrogen enables termination of dangling bonds with hydrogen in the crystalline semiconductor layers. For example, an insulating layer containing hydrogen is formed as the insulating layer 732, the insulating layer 734 is formed thereover, and then heat treatment for hydrogen termination is performed. In this case, the insulating layer 734 is formed at a temperature which does not cause dehydrogenation of the insulating layer 732.

For example, a silicon nitride oxide layer (thickness: 300 nm) as the insulating layer 732 and a silicon oxynitride layer (thickness: 450 nm) as the insulating layer 734 are sequentially formed by a plasma CVD method. As a process gas for forming the silicon nitride oxide layer, monosilane, ammonia, hydrogen, and nitrogen oxide are used. As a process gas for forming the silicon oxynitride layer, monosilane and nitrous oxide are used. When the treatment temperature is set to approximately 200° C. to 300° C., the insulating layer can be formed without dehydrogenation of the silicon nitride oxide layer. Then, after the formation of the insulating layer 734, heat treatment is performed at 450° C. in a nitrogen atmosphere for one hour; thereby terminating the crystalline semiconductor layers with hydrogen.

Figure 14C:
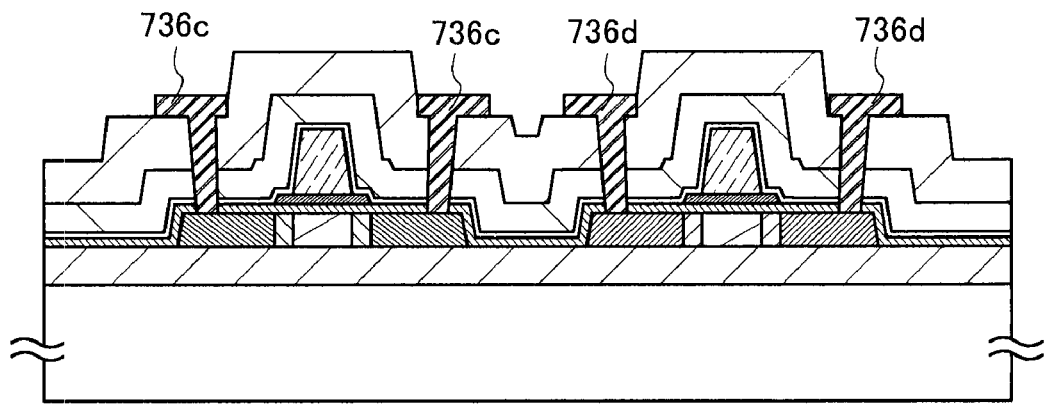

Next, contact holes are formed in the insulating layers 732, 731, and 710, and then the conductive layer 736c and the conductive layer 736d are formed so as to fill the contact holes (see FIG. 14C). Here, a pair of contact holes reaching the pair of first impurity regions 728d is formed, and a pair of conductive layers 736c reaching the first impurity regions 728d through the contact holes is formed. At the same time, a pair of contact holes reaching the pair of third impurity regions 728c is formed, and a pair of conductive layers 736d reaching the third impurity regions 728c through the contact holes is formed. The conductive layer 736c and the conductive layer 736d each serve as a source electrode or a drain electrode. The conductive layers 736c are electrically connected to the third impurity regions 728c. The conductive layers 736d are electrically connected to the first impurity regions 728d.

The conductive layer 736c and the conductive layer 736d are formed using an element selected from aluminum, tungsten, titanium, tantalum, molybdenum, nickel, neodymium, copper, or the like, or an alloy material or compound material which contains any of these elements. As the alloy material containing any of the elements, for example, an aluminum alloy containing titanium, an aluminum alloy containing neodymium, and an aluminum alloy containing silicon (also referred to as aluminum silicon) are given. As the compound material containing any of the elements, a nitride such as tungsten nitride, titanium nitride, tantalum nitride are given. The conductive layers 736c and 736d may be formed over the entire surface by using the aforementioned material by a sputtering method or a CVD method and then may be formed into a desired shape by selective etching. The conductive layers 736c and 736d can be formed to have a single layer structure or a stacked-layer structure including two or more layers. For example, a structure in which a titanium layer, a titanium nitride layer, an aluminum layer, and a titanium layer are sequentially stacked can be employed. By forming an aluminum layer between titanium layers, heat resistance can be increased. Further, a titanium nitride layer between a titanium layer and an aluminum layer can function as a barrier layer.

In the above-described manner, an n-channel field-effect transistor and a p-channel field-effect transistor can be manufactured using an SOI substrate.

The SOI substrate manufactured in the above embodiments includes a crystalline semiconductor layer having the crystallinity higher than that of a polycrystalline semiconductor layer obtained by crystallizing a conventional amorphous semiconductor layer with a laser. With the use of such an SOI substrate, a semiconductor element having high operation characteristics (e.g., the mobility) can be formed.

Note that the conductive layer 736c and the conductive layer 736d are electrically connected to each other so that the n-channel field-effect transistor and the p-channel field-effect transistor are electrically connected to each other; whereby a CMOS transistor can be formed.

In this embodiment, an example where the gate electrode has a stacked-layer structure including two conductive layers and the widths of the layers are different is described, but the present invention is not limited to this structure. For example, the gate electrode may have a single layer structure of a conductive layer or a stacked-layer structure including three or more conductive layers. Further, when the gate electrode has a stacked-layer structure of conductive layers, the widths of the layers may be substantially the same, and the tapered shapes of the layers may be different. Furthermore, an insulating layer in contact with the side surface of the gate electrode, called as a sidewall, may be formed.

By combining a plurality of transistors described in this embodiment, a semiconductor device with various functions can be manufactured. Note that the structure of the transistors described in this embodiment is one example, and the structure is not limited to the structure illustrated in the drawings.

Note that the structure described in this embodiment can be combined as appropriate with any structure described in the other embodiments in this specification.

Embodiment 7

Various semiconductor elements such as a capacitor and a resistor are formed in addition to the transistor described in Embodiment 6 by using the SOI substrate according to one embodiment of the present invention, so that a semiconductor device with high added value can be manufactured. In this embodiment, a specific mode of the semiconductor device is described with reference to drawings.

The microprocessor 2000 includes an arithmetic logic unit (also referred to as an ALU) 2001, an ALU controller 2002, an instruction decoder 2003, an interrupt controller 2004, a timing controller 2005, a register 2006, a register controller 2007, a bus interface (Bus I/F) 2008, a read-only memory 2009, and a memory interface 2010.

Figure 15:
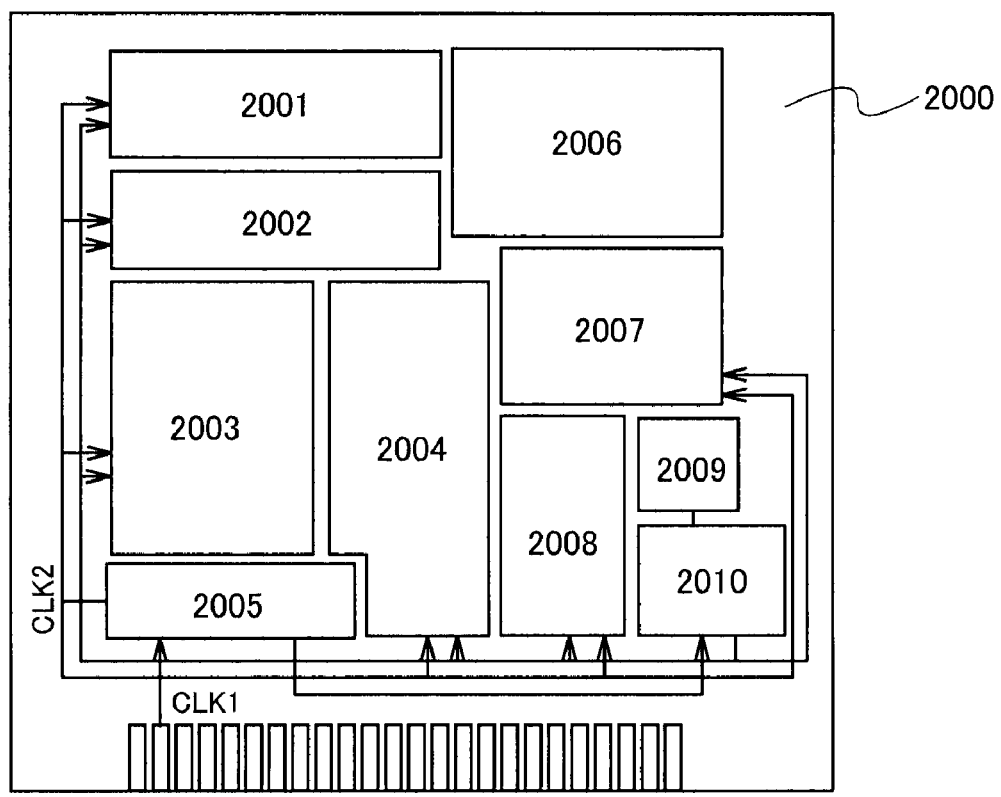
FIG. 15 is a block diagram illustrating an example of a structure of a microprocessor.

An instruction input to the microprocessor 2000 via the bus interface 2008 is input to the instruction decoder 2003 and decoded, and then input to the ALU controller 2002, the interrupt controller 2004, the register controller 2007, and the timing controller 2005. The ALU controller 2002, the interrupt controller 2004, the register controller 2007, and the timing controller 2005 conduct various controls based on the decoded instruction. Specifically, the ALU controller 2002 generates signals for controlling the operation of the ALU 2001. While the microprocessor 2000 is executing a program, the interrupt controller 2004 processes an interrupt request from an external input/output device or a peripheral circuit based on its priority or a mask state. The register controller 2007 generates an address of the register 2006, and reads and writes data from and to the register 2006 in accordance with the state of the microprocessor 2000. The timing controller 2005 generates signals for controlling timing of operation of the ALU 2001, the ALU controller 2002, the instruction decoder 2003, the interrupt controller 2004, and the register controller 2007. For example, the timing controller 2005 is provided with an internal clock generator for generating an internal clock signal CLK2 based on a reference clock signal CLK1, and supplies the clock signal CLK2 to the above-mentioned various circuits. Note that the microprocessor 2000 illustrated in FIG. 15 is only an example in which the configuration is simplified, and an actual microprocessor may can various configurations depending on the uses.

Figure 16:
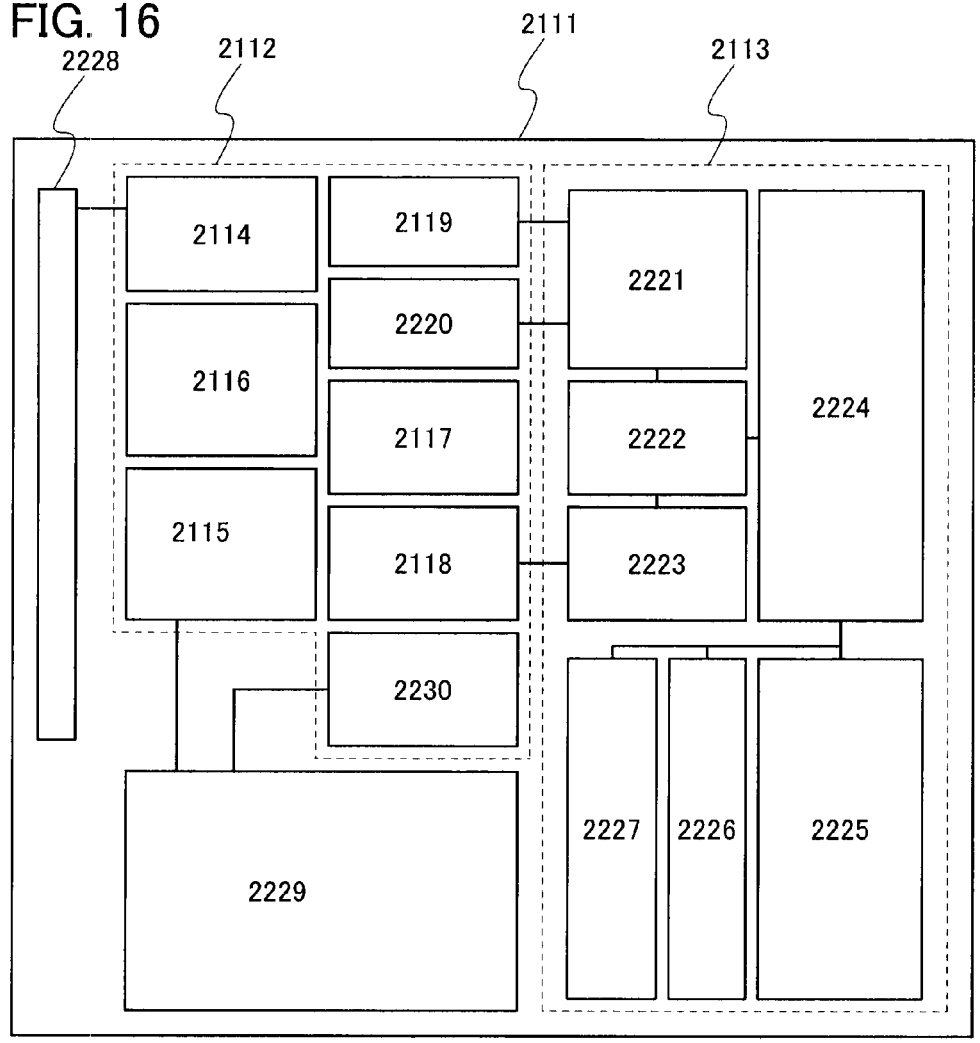
FIG. 16 is a block diagram illustrating an example of a structure of an RFCPU.

Next, an example of a semiconductor device including an arithmetic function that can transmit and receive data without contact is described with reference to FIG. 16. In FIG. 16, as a semiconductor device, an example of a computer that operates to transmit and receive signals to and from an external device by wireless communication (hereinafter referred to as an "RFCPU") is illustrated. An RFCPU 2111 includes an analog circuit portion 2112 and a digital circuit portion 2113. The analog circuit portion 2112 includes a resonance circuit 2114 with a resonance capacitor, a rectifier circuit 2115, a constant voltage circuit 2116, a reset circuit 2117, an oscillator circuit 2118, a demodulator circuit 2119, and a modulator circuit 2220. The digital circuit portion 2113 includes an RF interface 2221, a control register 2222, a clock controller 2223, a CPU interface 2224, a central processing unit (CPU) 2225, a random-access memory (RAM) 2226, and a read-only memory (ROM) 2227.

The operation of RFCPU 2111 is described below. A signal received at an antenna 2228 causes induced electromotive force at the resonant circuit 2114. The induced electromotive force is stored in a capacitor portion 2229 via the rectifier circuit 2115. The capacitor portion 2229 is preferably formed using a capacitor such as a ceramic capacitor or an electric double layer capacitor. The capacitor portion 2229 is not necessarily formed over the same substrate as the RFCPU 2111 and may be attached as another component to a substrate having an insulating surface which is included in the RFCPU 2111.

The reset circuit 2117 generates a signal that resets and initializes the digital circuit portion 2113. For example, the reset circuit 2117 generates a signal which rises with delay after increase in power supply voltage as a reset signal. The oscillator circuit 2118 changes the frequency and the duty ratio of a clock signal in accordance with a control signal generated at the constant voltage circuit 2116. For example, demodulator circuit 2119 formed using a low pass filter binarizes changes in the amplitude of a received an amplitude shift keying (ASK) signal. The modulator circuit 2220 transmits transmission data by changing the amplitude of transmission signals of an amplitude shift keying (ASK) system. The modulator circuit 2220 changes the resonance point of the resonance circuit 2114, thereby changing the amplitude of communication signals. The clock controller 2223 generates a control signal for changing the frequency and the duty ratio of a clock signal in accordance with the power supply voltage or a consumption current in the central processing unit 2225. The power supply voltage is monitored by a power supply control circuit 2230.

A signal that is input to the RFCPU 2111 from the antenna 2228 is demodulated by the demodulator circuit 2119, and then divided into a control command, data, and the like by the RF interface 2221. The control command is stored in the control register 2222. The control command includes, reading of data stored in the read only memory 2227, writing of data into the random access memory 2226, an arithmetic instruction to the central processing unit 2225, and the like. The central processing unit 2225 accesses the read only memory 2227, the random access memory 2226, and the control register 2222 via the central processing unit 2225. The CPU interface 2224 has a function of generating an access signal for any of the read only memory 2227, the random access memory 2226, and the control register 2222 based on an address requested by the central processing unit 2225.

As an arithmetic method of the central processing unit 2225, a method may be employed in which the read only memory 2227 stores an operating system (OS) and a program is read at the time of starting operation and executed. Alternatively, a method may be employed in which a circuit dedicated to arithmetic is formed and an arithmetic process is conducted using hardware. In a method in which both hardware and software are used, part of arithmetic processing can be conducted by a circuit dedicated to arithmetic, and the other part of the arithmetic processing can be conducted by the central processing unit 2225 using a program.

Semiconductor devices such as the microprocessor 2000 and the RFCPU 2111 can be manufactured using a circuit having various functions which is formed by combining a plurality of transistors. The transistor can be manufactured using the crystalline semiconductor layer in the SOI substrate according to the present invention. In addition, an inexpensive substrate such as a glass substrate can be used as a supporting substrate, thereby reducing cost. Accordingly, when an integrated circuit is manufactured by combining such transistors, higher performance, higher processing speed, lower cost, and the like of semiconductor devices such as a microprocessor and an RFCPU can be realized. Note that although FIG. 16 illustrates a mode of the RFCPU, the semiconductor device may be an IC tag as long as it has a communication function, an arithmetic processing function, and a memory function.

Next, a display device using the SOI substrate according to one embodiment of the present invention is described with reference to FIGS. 17A and 17B and FIGS. 18A and 18B.

Figure 17A:
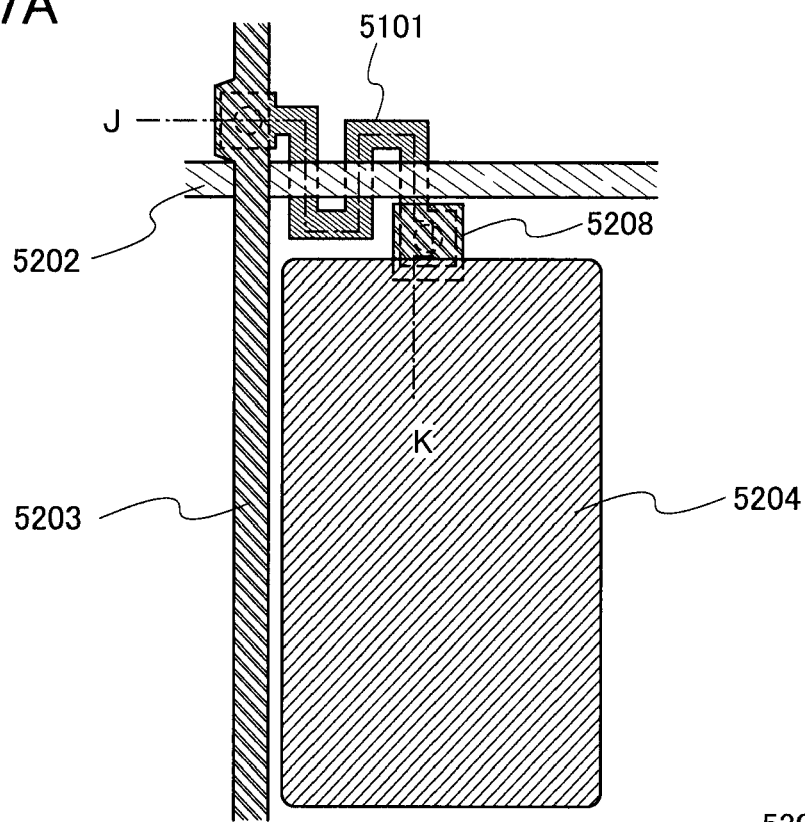
FIGS. 17A and 17B are a plan view and a cross-sectional view, respectively, of a pixel of a liquid crystal display device.
Figure 17B:
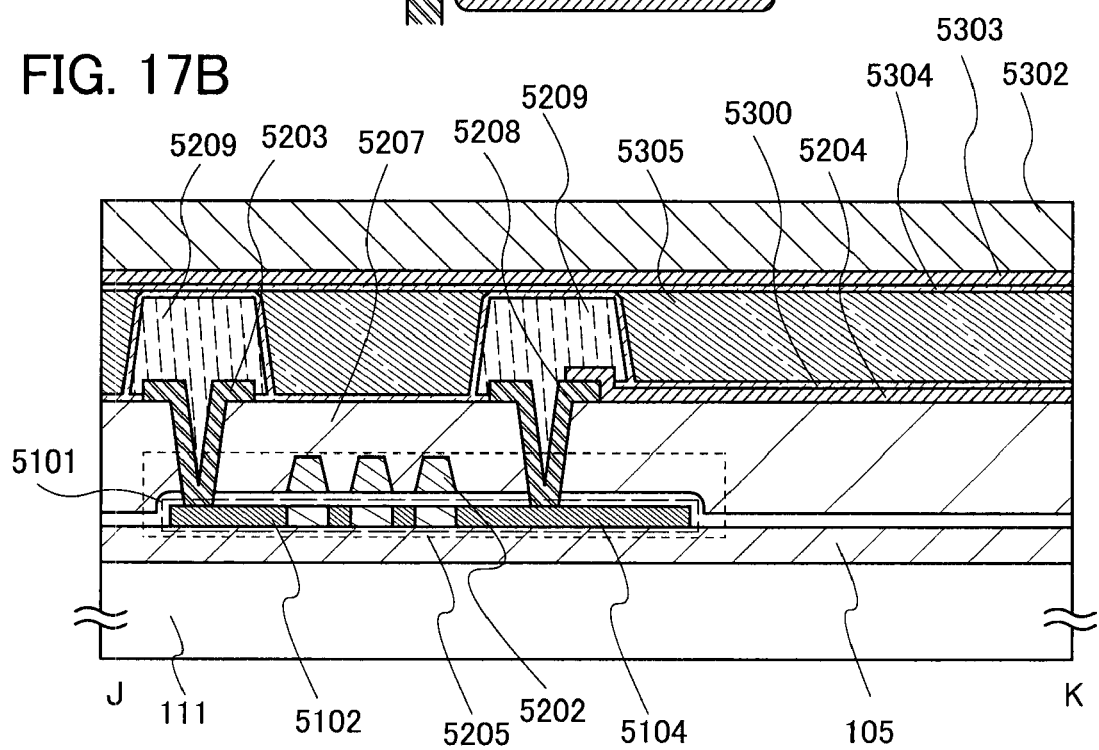

FIGS. 17A and 17B are diagrams illustrating a structural example of a liquid crystal display device. FIG. 17A is a plan view of a pixel of the liquid crystal display device, and FIG. 17B is a cross-sectional view along a section line J-K in FIG. 17A. In FIG. 17A, a crystalline semiconductor layer 5101 is included in a transistor 5205 of a pixel. The pixel includes the crystalline semiconductor layer 5101; a scan line 5202 that crosses the crystalline semiconductor layer 5101; a signal line 5203 that crosses the scan line 5202; a pixel electrode 5204; and an electrode 5208 that electrically connects the pixel electrode 5204 and the crystalline semiconductor layer 5101. The crystalline semiconductor layer 5101 is formed from a crystalline semiconductor layer included in the SOI substrate according to one embodiment of the present invention. It is preferable that a glass substrate be used as the supporting substrate 111.

As illustrated in FIG. 17B, the buffer layer 105 and the crystalline semiconductor layer 5101 are stacked over the supporting substrate 111. The crystalline semiconductor layer 5101 is formed by element isolation of the crystalline semiconductor layer 163 by etching. In the crystalline semiconductor layer 5101, a channel formation region 5102 and an n-type impurity region 5104 are formed. A gate electrode of the transistor 5205 is included in the scan line 5202, and one of a source electrode and a drain electrode is included in the signal line 5203.

Over an interlayer insulating layer 5207, the signal line 5203, the pixel electrode 5204, and the electrode 5208 are provided. Column spacers 5209 are formed over the interlayer insulating layer 5207, and an orientation film 5300 is formed covering the signal line 5203, the pixel electrode 5204, the electrode 5208, and the column spacers 5209. On a counter substrate 5302, a counter electrode 5303 and an orientation film 5304 covering the counter electrode 5303 are formed. The columnar spacers 5209 are formed in order to maintain space between the supporting substrate 111 and the counter substrate 5302. A liquid crystal layer 5305 is formed in the space kept by the columnar spacers 5209, which is between the orientation film 5304 on the counter substrate 532 side and the orientation film 5300 on the supporting substrate 111 side. At respective connection portions of the signal line 5203 and the electrode 5208 with the impurity region 5104, there are steps caused by the interlayer insulating layer 5207, the signal line 5203, and the electrode 5208; accordingly, orientation of liquid crystals in the liquid crystal layer 5305 is likely to be disordered at the connection portion. Therefore, the columnar spacers 5209 are formed in step portions to prevent the disorder of orientation of liquid crystals.

Note that a glass substrate can be used as the supporting substrate 111. Accordingly, a liquid crystal display device manufactured using the SOI substrate according to one embodiment of the present invention, is not limited to a reflective liquid crystal display device and also can be a transmissive liquid crystal display device or a semi-transmissive liquid crystal display device.

Figure 18A:
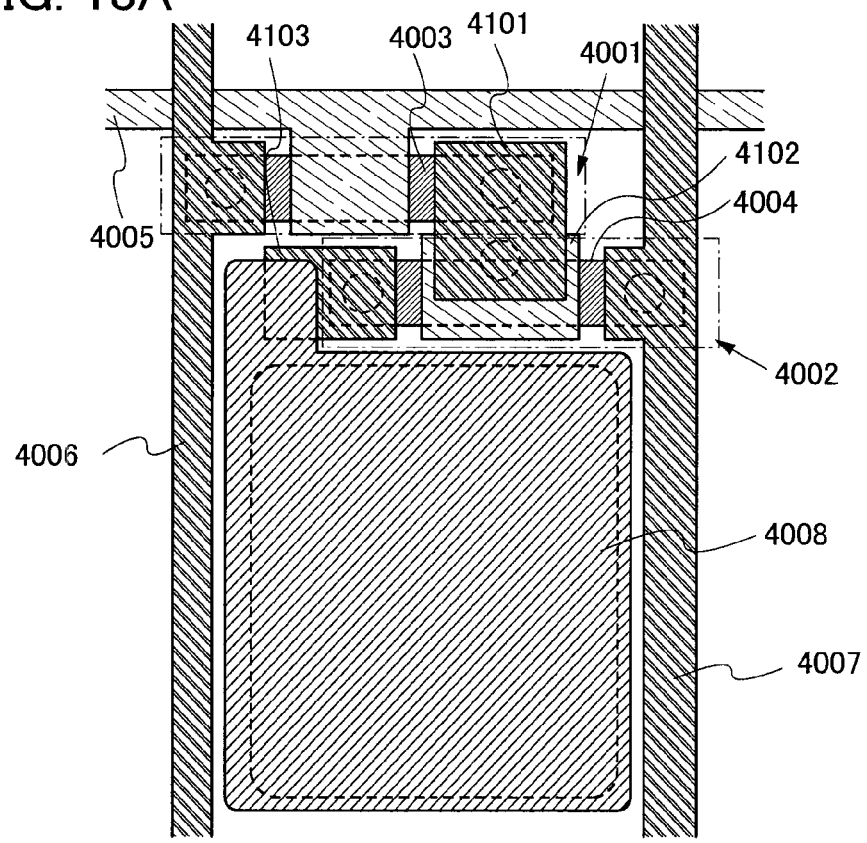
FIGS. 18A and 18B are a plan view and a cross-sectional view, respectively, of a pixel of an EL display device.
Figure 18B:
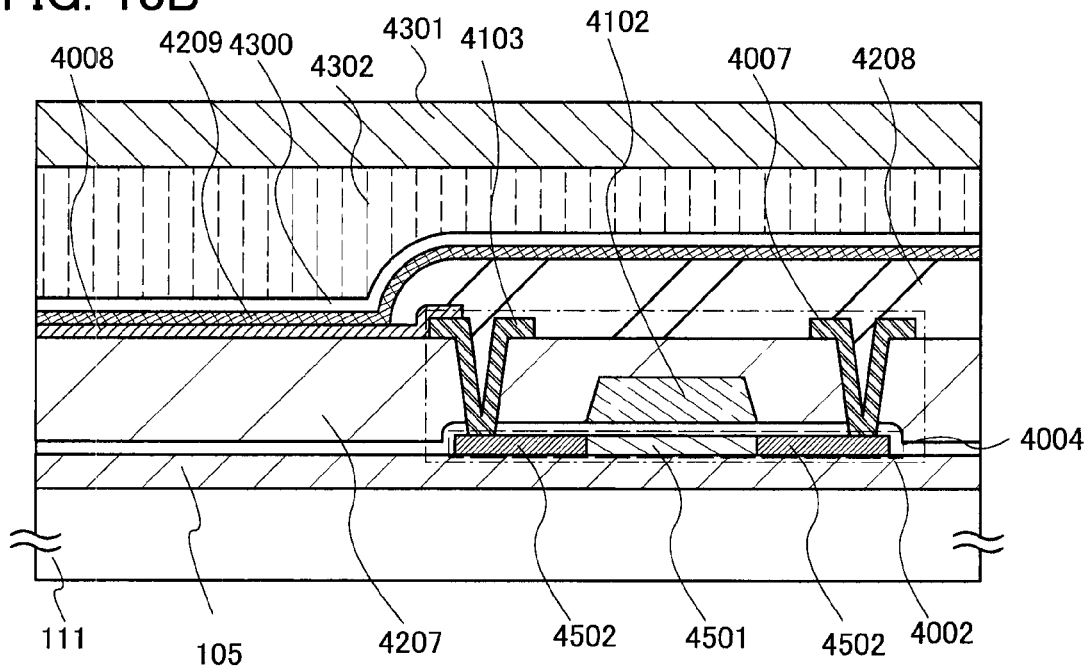

Next, an EL display device is described. FIG. 18A is a plan view of a pixel in an EL display device, and FIG. 18B is a cross-sectional view of the pixel. As illustrated in FIG. 18A, the pixel includes a selecting transistor 4001 and a display control transistor 4002, which are transistors, a scan line 4005, a signal line 4006, a current supply line 4007, and a pixel electrode 4008. Each pixel is provided with a light-emitting element having a structure in which a layer including an electroluminescent material (an organic compound layer including at least a light-emitting layer) is sandwiched between a pair of electrodes. One of the electrodes of the light-emitting element is the pixel electrode 4008.

A crystalline semiconductor layer 4003 included in the selecting transistor 4001 and a crystalline semiconductor layer 4004 included in the display control transistor 4002 are each formed from a crystalline semiconductor layer included in an SOI substrate according to one embodiment of the present invention. It is preferable that a glass substrate be used as the supporting substrate 111.

In the selecting transistor 4001, a gate electrode is included in the scan line 4005, one of a source electrode and a drain electrode is included in the signal line 4006, and the other thereof is formed as an electrode 4101. In the display control transistor 4002, a gate electrode 4102 is electrically connected to the electrode 4101, one of a source electrode and a drain electrode is formed as an electrode 4013 electrically connected to the pixel electrode 4008, and the other thereof is included in the current supply line 4007.

The display control transistor 4002 is a p-channel field-effect transistor. As illustrated in FIG. 18B, in the crystalline semiconductor layer 4004, a channel formation region 4501 and a p-type impurity region 4502 are formed. An interlayer insulating layer 4207 is formed to cover the gate electrode 4102 of the display control transistor 4002. Over the interlayer insulating layer 4207, the signal line 4006, the current supply line 4007, the electrode 4101, the electrode 4103, and the like are formed. Further, over the interlayer insulating layer 4207, the pixel electrode 4008 electrically connected to the electrode 4103 is formed. A peripheral portion of the pixel electrode 4008 is surrounded by an insulating partition layer 4208. An organic compound layer 4209 is formed over the pixel electrode 4008, and a counter electrode 4003 is formed over the organic compound layer 4209. A counter substrate 4301 is provided as a reinforcing plate, and the counter substrate 431 is fixed to the supporting substrate 111 with a resin layer 4302.

As the supporting substrate 111, a glass substrate can be used. Therefore, the structure of an EL display device manufactured using the SOI substrate according to one embodiment of the present invention is not limited to a top emission structure in which light is extracted from a counter substrate side, and can be a bottom emission structure in which light is extracted from a supporting substrate side.

The transistor using the crystalline semiconductor layer in the SOI substrate according to one embodiment of the present invention can be applied to the liquid crystal display device illustrated in FIGS. 17A and 17B and the EL display device illustrated in FIGS. 18A and 18B. The crystallinity of the crystalline semiconductor layer according to one embodiment of the present invention is higher than that of a polycrystalline semiconductor layer obtained by crystallizing a conventional amorphous semiconductor layer with a laser, because the crystalline semiconductor layer is formed by crystallization using single crystal semiconductors as seed crystals. When a channel formation region of a transistor is formed using a crystalline semiconductor layer with a high crystallinity, higher performance of a transistor, which, for example, drives a pixel included in a display device, can be achieved, and further, a high-definition display device can be provided.

Further, since a glass substrate can be used as the supporting substrate as described above, the supporting substrate can transmit light, which is differ from the case of using a semiconductor substrate as the supporting substrate. Therefore, the structure can be selected as appropriate among a structure in which light is extracted from the supporting substrate side (a structure in which the supporting substrate transmits light), a structure in which light is extracted from the counter substrate side (a structure in which the counter substrate transmits light), a structure in which light is extracted from both substrates (a structure in which both substrates transmit light), and the like.

A semiconductor device manufactured using the SOI substrate according to one embodiment of the present invention can be applied to various electronic appliances. Examples of the electronic appliances include portable information terminals (such as mobile computers, cellular phones, portable game machines, and electronic book readers); sound reproduction devices (such as car audio systems and audio components); computers; video cameras; digital cameras; navigation systems; game machines; and display devices for displaying image data such as an image reproduction device provided with a recording medium (specifically, a digital versatile disc (DVD)).

Figure 19A:
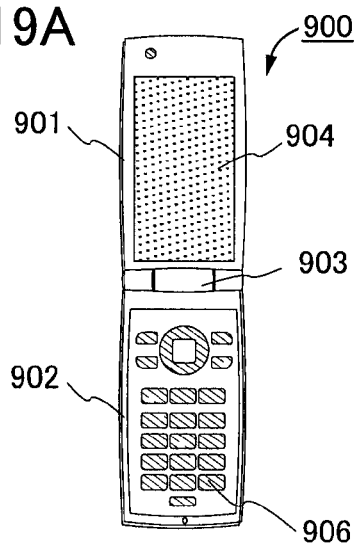
FIGS. 19A to 19C are external views each illustrating an example of an electronic device.
Figure 19B:
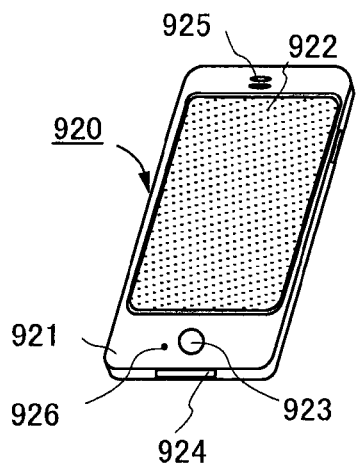
Figure 19C:
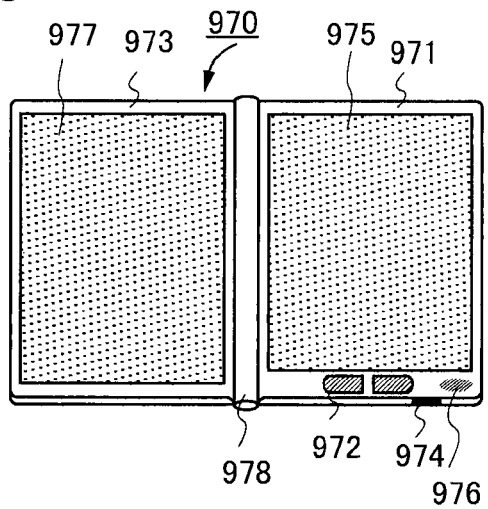

With reference to FIGS. 19A to 19C, specific modes of the electronic appliances are described. FIG. 19A is an external view illustrating an example of a cellular phone 900. The cellular phone 900 has two housings: a housing 901 and a housing 902. The housing 901 and the housing 902 are joined with a joining portion 903 such that the cellular phone is foldable. A display portion 904 is incorporated in the housing 901. Operation keys 906 are provided with the housing 902. Note that the structure of the cellular phone 900 is not particularly limited as long as it is provided with, at least, an element manufactured using the SOI substrate according to one embodiment of the present invention. The cellular phone 900 may have a structure in which additional accessory equipment is provided as appropriate. For example, when the display device described in FIGS. 17A and 17B or FIGS. 18A and 18B is applied to the display portion 904, higher definition can be realized. Further, a defect in a process for manufacturing a semiconductor element using the SOI substrate can be prevented; thus, the yield of the display device incorporated in a cellular phone can be improved.

FIG. 19B is an external view illustrating an example of a personal digital assistance (a PDA) 920. The PDA 920 is provided with a display portion 922 incorporated in a housing 921, operation keys 923, an external connection port 924, a speaker 925, a microphone 926, and the like. The PDA 920 may have a function of a cellular phone. The structure of the PDA 920 is not particularly limited as long as it is provided with, at least, an element manufactured using the SOI substrate according to one embodiment of the present invention. The PDA 920 may have a structure in which additional accessory equipment is provided as appropriate. For example, the display device described in FIGS. 17A and 17B or FIGS. 18A and 18B is applied to the display portion 922, higher definition thereof can be realized.

Information can be input to the PDA 920 illustrated in FIG. 19B by touching the display portion 922 with a finger or the like. In addition, operations such as making a call and text messaging can be conducted by touching the display portion 922 with a finger or the like.

There are mainly three screen modes of the display portion 922. The first mode is a display mode mainly for displaying images. The second mode is an input mode mainly for inputting data such as text. The third mode is a display-and-input mode in which two modes of the display mode and the input mode are combined.

For example, in the case of making a call or text messaging, a text input mode mainly for inputting text is selected for the display portion 922 so that text displayed on a screen can be input. In that case, it is preferable to display a keyboard or number buttons on almost all the area of the screen of the display portion 922.

When a detection device including a sensor for detecting inclination, such as a gyroscope or an acceleration sensor, is provided inside the PDA 920, display on the screen of the display portion 922 can be automatically switched by determining the direction of the PDA 920 (whether the PDA 920 is placed horizontally or vertically for a landscape mode or a portrait mode).

The screen mode is switched by touching the display portion 922 or operating the operation buttons 923 of the housing 921. Alternatively, the screen mode can be switched depending on the kind of images displayed on the display portion 922. For example, when a signal of an image displayed on the display portion is of moving image data, the screen mode is switched to the display mode. When the signal is of text data, the screen mode is switched to the input mode.

Furthermore, in the input mode, when input by touching the display portion 922 is not performed for a certain period while a signal is detected by the optical sensor in the display portion 922, the screen mode may be controlled so as to be switched from the input mode to the display mode.

The display portion 922 may function as an image sensor. For example, an image of a palm print, a fingerprint, or the like is taken by touching the display portion 922 with the palm or the finger, whereby personal authentication can be performed. Furthermore, by providing a backlight or sensing light source emitting near-infrared light for the display portion, an image of a finger vein, a palm vein, or the like can also be taken.

FIG. 19C illustrates an example of an electronic book reader 970. For example, the electronic book reader 970 has two housings: a housing 971 and a housing 973. The housing 971 and the housing 973 are combined with a hinge 978 so that the electronic book reader 970 can be opened and closed with the hinge 978 as an axis. With such a structure, the electronic book reader 970 can be operated like a paper book.

A display portion 975 and a display portion 977 are incorporated in the housing 971 and the housing 973, respectively. The display portion 975 and the display portion 977 may display one image or different images. In the case where the display portion 975 and the display portion 977 display different images, for example, text can be displayed on a display portion on the right side (the display portion 975) and graphics can be displayed on a display portion on the left side (the display portion 977).

The structure of the electronic book reader 970 is not particularly limited as long as it is provided with, at least, an element manufactured using the SOI substrate according to one embodiment of the present invention. The electronic book reader 970 may have a structure in which additional accessory equipment is provided as appropriate.

FIG. 19C illustrates an example in which the housing 971 is provided with an operation portion and the like. For example, the housing 971 is provided with a power switch 974, operation keys 972, a speaker 976, and the like. With the operation keys 972, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book reader 970 may have a function of an electronic dictionary.

The electronic book reader 970 may have a configuration capable of wirelessly transmitting and receiving data. Through wireless communication, desired book data or the like can be purchased and downloaded from an electronic book server.

Note that the structure described in this embodiment can be combined as appropriate with any structure described in the other embodiments in this specification.

Embodiment 8

In this embodiment, an example of manufacturing a semiconductor device using the SOI substrate according to one embodiment of the present invention, which is different from that described in the above embodiment, is described.

When various integrated circuits are formed using semiconductor elements such as transistors, there are some cases where characteristics required for the semiconductor elements differ in accordance with the use of each circuit including the semiconductor element, as the integrated circuits are increased in size and functionality. For example, some circuits require high-speed operation and/or low-voltage driving and other circuits require sufficient reliability (high withstand-voltage characteristics) at the time of high-voltage application.

In this embodiment, an example is described where circuits for which different characteristics are required are formed over the same substrate by using the SOI substrate, which is described in the above embodiment, provided with the crystalline semiconductor layer including regions whose thicknesses are different.

Figure 20A:
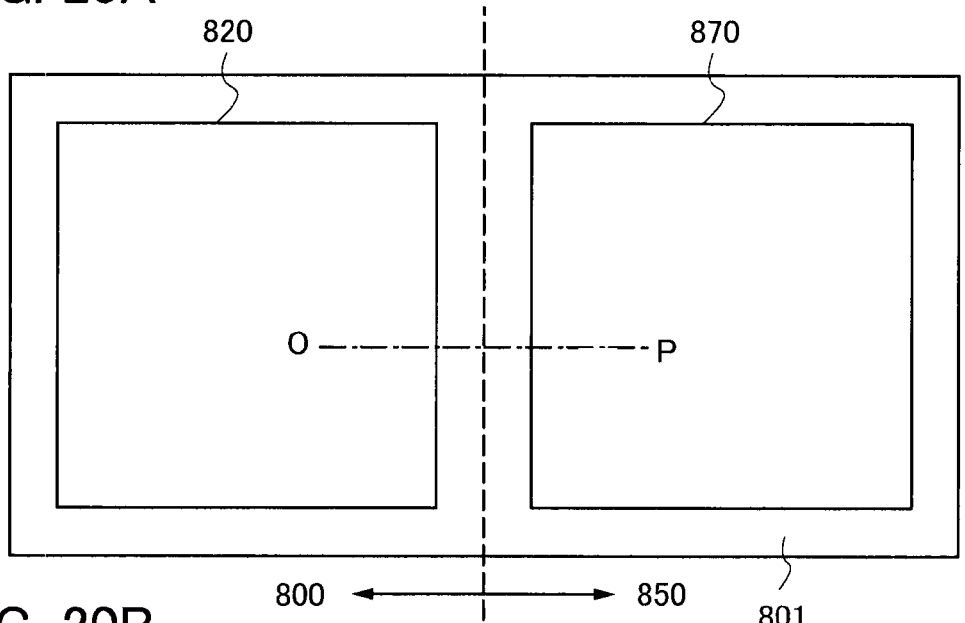
FIGS. 20A to 20C are views illustrating a semiconductor device according to one embodiment of the present invention.
Figure 20B:
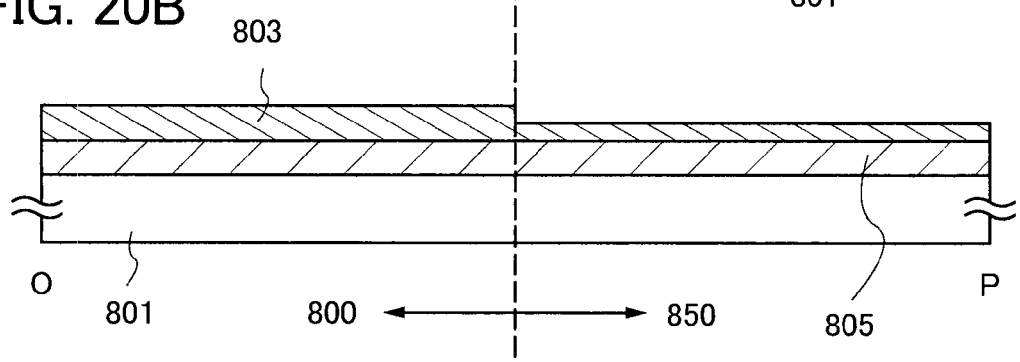

In FIGS. 20A and 20B, a crystalline semiconductor layer 803 is formed over a supporting substrate 801. The crystalline semiconductor layer 803 includes a first region 800 and a second region 850. A first circuit group 820 and a second circuit group 870 are formed in the first region 800 and the second region 850, respectively. Note that FIG. 20A is a simplified plan view, and FIGS. 20B and 20C are each a simplified cross-sectional view taken along line O-P in FIG. 20A.

In FIG. 20B, the thickness of the crystalline semiconductor layer 803 in the first region 800 is thicker than that of the crystalline semiconductor layer 803 in the second region 850. Such an SOI substrate can be obtained when, for example, the first region 800 is a region provided with a single crystal semiconductor as a seed crystal and the second region 850 is a region where non-single crystal semiconductor layer is formed directly on a buffer layer 805 and is crystallized using a single crystal semiconductor as a seed crystal.

For example, the region having a thick thickness in the crystalline semiconductor layer 563 illustrated in FIG. 10C of Embodiment 4 (a region where the single crystal semiconductor 501 is formed and the vicinity thereof in FIG. 10A) can be the first region 800. On the other hand, the region having a thin thickness in the crystalline semiconductor layer 563 illustrated in FIG. 10C (a region where only the non-single crystal semiconductor layer 541 is formed on the buffer layer 505 and the vicinity thereof in FIG. 10A) can be the second region 850.

Figure 20C:
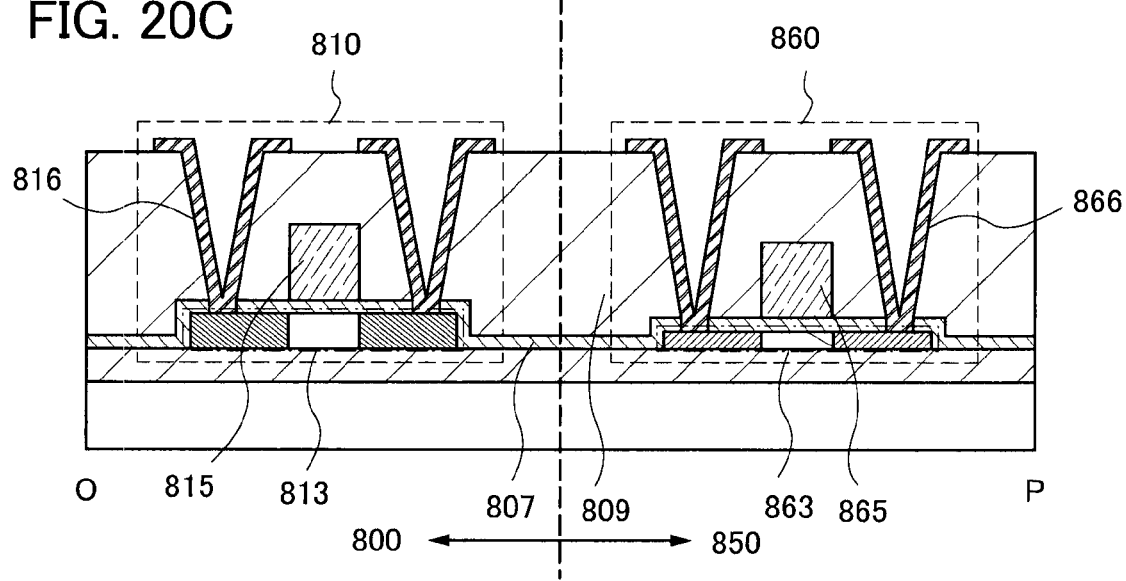

In FIG. 20C, a first transistor 810 and a second transistor 860 are provided in the first region 800 and the second region 850, respectively. The first transistor 810 is an example of an element included in the first circuit group 820 and the second transistor 860 is an example of an element included in the second circuit group 870.

The first transistor 810 includes the following: a crystalline semiconductor layer 813 including a channel formation region, a source region, and a drain region; a gate electrode 815 formed over the crystalline semiconductor layer 813 with a gate insulating layer 807 provided therebetween; an insulating layer 809 formed over the entire surface of the gate insulating layer 807 and the gate electrode 815; and an electrode 816 electrically connected to the crystalline semiconductor layer 813 through an opening formed in the insulating layer 809 and the gate insulating layer 807. Similarly, the second transistor 860 includes the following: a crystalline semiconductor layer 863 including a channel formation region, a source region, and a drain region; a gate electrode 865 formed over the crystalline semiconductor layer 863 with a gate insulating layer 807 provided therebetween; an insulating layer 809 formed over the entire surface of the gate insulating layer 807 and the gate electrode 865; and an electrode 866 electrically connected to the crystalline semiconductor layer 863 through an opening formed in the insulating layer 809 and the gate insulating layer 807. Note that the electrodes 816 and 866 each serve as a source electrode or a drain electrode.

In FIG. 20C, the first transistor 810 includes the crystalline semiconductor layer 813 thicker than the crystalline semiconductor layer 863 included in the second transistor 860. The first transistor 810 formed using such a thick crystalline semiconductor layer 813 is preferably used for forming a circuit for which high withstand-voltage is required. On the other hand, the second transistor 860 formed using the crystalline semiconductor layer 863 having a thin thickness as compared with the crystalline semiconductor layer 813 included in the first transistor 810 is preferably used for forming a circuit for which high-speed operation and/or low-voltage driving are/is required.

As described above, the crystalline semiconductor layer including regions of which thicknesses are different and according to one embodiment of the present invention is used, whereby semiconductor elements appropriate for required characteristics can be easily formed over the same substrate.

Note that the structure described in this embodiment can be combined as appropriate with any structure described in the other embodiments in this specification.

This application is based on Japanese Patent Application serial no. 2009-071103 filed with Japan Patent Office on Mar. 24, 2009, the entire contents of which are hereby incorporated by reference.

What is claimed is:

1. A method for manufacturing an SOI substrate, comprising the steps of:
providing a plurality of island shaped single crystal semiconductors selectively over a supporting substrate with a buffer layer provided therebetween, the plurality of island shaped single crystal semiconductors being separated from a single crystal semiconductor substrate;
forming a non-single crystal semiconductor layer over the buffer layer, the non-single crystal semiconductor layer being in contact with the single crystal semiconductor; and
crystallizing the non-single crystal semiconductor layer using the plurality of island shaped single crystal semiconductors as seed crystals by laser beam irradiation,
wherein the plurality of island shaped single crystal semiconductors are arranged at regular intervals.

2. The method for manufacturing an SOI substrate according to claim 1, wherein the plurality of island shaped single crystal semiconductors are provided selectively and partly to make a dot-pattern or a stripe pattern.

3. The method for manufacturing an SOI substrate according to claim 1, wherein the plurality of island shaped single crystal semiconductors are partly separated to form the single crystal semiconductor whose shape is a cluster-shape.

4. The method for manufacturing an SOI substrate according to claim 1, wherein the plurality of island shaped single crystal semiconductors whose crystal orientation is aligned are partly formed.

5. The method for manufacturing an SOI substrate according to claim 1, wherein the laser beam irradiation is conducted while the non-single crystal semiconductor layer or the plurality of island shaped single crystal semiconductors is/are sprayed with a heated inert gas.

6. The method for manufacturing an SOI substrate according to claim 1, wherein the laser beam irradiation is conducted while the supporting substrate is heated.

7. A method for manufacturing an SOI substrate, comprising the steps of:
irradiating a single crystal semiconductor substrate with accelerated ions to form a fragile layer in the single crystal semiconductor substrate;
attaching the single crystal semiconductor substrate and a supporting substrate with a buffer layer provided therebetween;
separating partly the single crystal semiconductor substrate along the fragile layer by heat treatment to form a single crystal semiconductor layer over the supporting substrate with the buffer layer provided therebetween;
selectively etching the single crystal semiconductor layer to form a plurality of island shaped single crystal semiconductors over the supporting substrate with the buffer layer provided therebetween;
forming a non-single crystal semiconductor layer over the buffer layer, the non-single crystal semiconductor layer being in contact with the plurality of island shaped single crystal semiconductors; and
crystallizing the non-single crystal semiconductor layer using the plurality of island shaped single crystal semiconductors as seed crystals by laser beam irradiation,
wherein the plurality of island shaped single crystal semiconductors is arranged at regular intervals.

8. The method for manufacturing an SOI substrate according to claim 7, wherein the plurality of island shaped single crystal semiconductors are provided to make a dot-pattern or a stripe pattern.

9. The method for manufacturing an SOI substrate according to claim 7, wherein the single crystal semiconductor substrate is partly separated to form the plurality of island shaped single crystal semiconductors each having a cluster-shape.

10. The method for manufacturing an SOI substrate according to claim 7, wherein crystal orientations of the plurality of island shaped single crystal semiconductors are aligned.

11. The method for manufacturing an SOI substrate according to claim 7, wherein the laser beam irradiation is conducted while the non-single crystal semiconductor layer or the plurality of island shaped single crystal semiconductors is/are sprayed with a heated inert gas.

12. The method for manufacturing an SOI substrate according to claim 7, wherein the laser beam irradiation is conducted while the supporting substrate is heated.

13. A method for manufacturing an SOI substrate, comprising the steps of:
selectively etching a single crystal semiconductor substrate so that a surface of the single crystal semiconductor substrate has a plurality of projecting portions;
irradiating the single crystal semiconductor substrate with accelerated ions from the surface having the plurality of projecting portions to form a plurality of fragile layers in the single crystal semiconductor substrate;
attaching the single crystal semiconductor substrate and a supporting substrate with a buffer layer provided therebetween;
separating partly the single crystal semiconductor substrate along the plurality of fragile layers by heat treatment to form a plurality of island shaped single crystal semiconductors over the supporting substrate with the buffer layer provided therebetween;
forming a non-single crystal semiconductor layer over the buffer layer, the non-single crystal semiconductor layer being in contact with the plurality of island shaped single crystal semiconductors; and crystallizing the non-single crystal semiconductor layer using the plurality of island shaped single crystal semiconductors as seed crystals by laser beam irradiation, wherein the plurality of island shaped single crystal semiconductors is arranged at regular intervals.

14. The method for manufacturing an SOI substrate according to claim 13, wherein the plurality of island shaped single crystal semiconductors are provided to make a dot-pattern or a stripe pattern.

15. The method for manufacturing an SOI substrate according to claim 13, wherein the single crystal semiconductor substrate is partly separated to form the plurality of island shaped single crystal semiconductors each having a cluster-shape.

16. The method for manufacturing an SOI substrate according to claim 13, wherein crystal orientations of the plurality of island shaped single crystal semiconductors are aligned.

17. The method for manufacturing an SOI substrate according to claim 13, wherein the laser beam irradiation is conducted while the non-single crystal semiconductor layer or the plurality of island shaped single crystal semiconductors is/are sprayed with a heated inert gas.

18. The method for manufacturing an SOI substrate according to claim 13, wherein the laser beam irradiation is conducted while the supporting substrate is heated.

19. A method for manufacturing an SOI substrate, comprising the steps of:
irradiating a single crystal semiconductor substrate with accelerated ions to form a fragile layer in the single crystal semiconductor substrate;
selectively etching the single crystal semiconductor substrate so that a surface of the single crystal semiconductor substrate has a plurality of projecting portions and the fragile layer is divided into a plurality of fragile layers;
attaching the single crystal semiconductor substrate and a supporting substrate with a buffer layer provided therebetween;
separating partly the single crystal semiconductor substrate along the plurality of fragile layers by heat treatment to form a plurality of island shaped single crystal semiconductors over the supporting substrate with the buffer layer provided therebetween;
forming a non-single crystal semiconductor layer over the buffer layer, the non-single crystal semiconductor layer being in contact with the plurality of island shaped single crystal semiconductors; and
crystallizing the non-single crystal semiconductor layer using the plurality of island shaped single crystal semiconductors as seed crystals by laser beam irradiation,
wherein the plurality of island shaped single crystal semiconductors is arranged at regular intervals.

20. The method for manufacturing an SOI substrate according to claim 19, wherein the plurality of island shaped single crystal semiconductors are provided to make a dot-pattern or a stripe pattern.

21. The method for manufacturing an SOI substrate according to claim 19, wherein the single crystal semiconductor substrate is partly separated to form the plurality of island shaped single crystal semiconductors each having a cluster-shape.

22. The method for manufacturing an SOI substrate according to claim 19, wherein crystal orientations of the plurality of island shaped single crystal semiconductors are aligned.

23. The method for manufacturing an SOI substrate according to claim 19, wherein the laser beam irradiation is conducted while the non-single crystal semiconductor layer or the plurality of island shaped single crystal semiconductors is/are sprayed with a heated inert gas.

24. The method for manufacturing an SOI substrate according to claim 19, wherein the laser beam irradiation is conducted while the supporting substrate is heated.

* * * * *